United States Patent
Skinner et al.

(10) Patent No.: US 10,581,407 B2
(45) Date of Patent: Mar. 3, 2020

(54) SCALABLE FIR FILTER

(71) Applicant: The Boeing Company, Chicago, IL (US)

(72) Inventors: Kristina M. Skinner, Hawthorne, CA (US); Tyler J. Thrane, El Segundo, CA (US); Jason A. Ching, Irvine, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/974,687

(22) Filed: May 8, 2018

(65) Prior Publication Data

US 2019/0348970 A1    Nov. 14, 2019

(51) Int. Cl.
    *G06F 17/10* (2006.01)
    *H03H 17/02* (2006.01)
    *H03H 17/06* (2006.01)

(52) U.S. Cl.
    CPC .... *H03H 17/0223* (2013.01); *H03H 17/0211* (2013.01); *H03H 17/06* (2013.01); *H03H 2017/0245* (2013.01)

(58) Field of Classification Search
    None
    See application file for complete search history.

(56) References Cited

U.S. PATENT DOCUMENTS

| | | | | |
|---|---|---|---|---|
| 6,260,053 B1 * | 7/2001 | Maulik | ............ | H03H 17/0276 708/313 |
| 7,353,243 B2 * | 4/2008 | Scheuermann | .... | H03H 17/0294 708/316 |
| 7,409,418 B2 * | 8/2008 | Saha | ................. | H03H 17/0223 708/303 |
| 7,433,909 B2 * | 10/2008 | Scheuermann | ..... | G06F 15/7867 708/400 |
| 9,391,591 B2 * | 7/2016 | Mehrnia | ........... | H03H 17/0219 |
| 2002/0146062 A1 * | 10/2002 | Bachu | ................. | H04B 1/7105 375/144 |
| 2002/0184275 A1 * | 12/2002 | Dutta | ................. | H03H 17/0275 708/300 |
| 2004/0153487 A1 * | 8/2004 | Saha | ................. | H03H 17/0223 708/306 |

OTHER PUBLICATIONS https://dspguru.com/dsp/faqs/fir/properties/, printed on Jul. 31, 2019, 3 pages.
https://en.wikipedia.org/wiki/Finite_impulse_response, printed Jul. 31, 2019, 6 pages.

* cited by examiner

*Primary Examiner* — David H Malzahn
(74) *Attorney, Agent, or Firm* — Moore Intellectual Property Law, PLLC

(57) ABSTRACT

A Scalable Finite Impulse Response ("SFIR") filter is disclosed. The SFIR filter includes a pre-processing section, a post-processing section, and a finite impulse response ("FIR") Matrix. The FIR Matrix includes a plurality of filter taps and a plurality of signal paths in signal communication with each filter tap. The plurality of signal paths are arranged to allow re-configurable data throughput between the each filter tap and the pre-processing section and post-processing section are in signal communication with the FIR Matrix.

20 Claims, 17 Drawing Sheets

SCALABLE FIR FILTER

GOVERNMENT INTEREST

This invention was made with United States Government support. The government has certain rights in the invention.

BACKGROUND

1. Field

The present disclosure is related to filters, and more specifically, finite impulse response ("FIR") filters.

2. Related Art

Digital filters are a key element in digital signal processing ("DSP") applications, in particular any application that may transmit or receive a Radio Frequency (RF) signal. Moreover, Finite Impulse Response ("FIR") Filters are a type of filter that is frequently used to perform matrix multiplication operations between input data and a set of coefficients. However, generally, the larger a filter becomes, the more difficult the filter becomes to manufacture when implemented in an Application Specific Integrated Circuit ("ASIC") because of the number of required routes associated with the filter.

Generally, software (e.g., processors) or hardware (e.g., ASICs or Field Programmable Gate Arrays ["FPGAs"]) approaches are utilized for DSP applications. Hardware approaches are generally utilized for intensive DSP applications that require pipelining to achieve high data rates. However, a problem with both ASIC and FPGA devices is that a significant amount of the die area of both are consumed by filtering resources. This is because DSP applications typically involve a significant amount of filtering that may be estimated as needing approximately half the resources in a given application.

The problem with software approaches is that software solutions have difficulty with computational intensive DSP applications such as, for example, streaming data. Known hardware approaches are more suitable for these types of DSP applications but have varying problems with flexibility, efficiency, costs, size, weight, and power.

Specifically, the problem with ASICs is that they are integrated circuits that are fabricated from a predetermined design that is designed to perform a specific application. As such, they are efficient but traditionally inflexible because, again, they are designed and fabricated to perform very specific applications and do not have the flexibility to perform other functions or applications. Because of this limitation, they have high non-recurring engineering ("NRE") costs in both the design and fabrication processes.

Unlike ASICs, FPGAs are flexible in operation because they may be programmed to perform different functions and applications. However, this flexible comes at a cost in high physical size and weight of the die and high power costs known as SWAP (size, weight, and power). As such, FPGAs are flexible but inherently inefficient.

Therefore, there is a need for a FIR filter design that is flexible, cost effective (i.e., has low NRE costs), and efficient (i.e., low SWAP).

SUMMARY

Disclosed is a Scalable Finite Impulse Response ("SFIR") filter. The SFIR filter includes a pre-processing section, a post-processing section, and a finite impulse response ("FIR") filtering matrix. The FIR Matrix includes a plurality of filter taps and a plurality of signal paths in signal communication with each filter tap. The plurality of signal paths are arranged to allow re-configurable data throughput between the each filter tap and the pre-processing module and post-processing module are in signal communication with the FIR Matrix.

Further disclosed is an Application Specific Integrated Circuit ("ASIC"). The ASIC includes the SFIR filter, where the SFIR filter includes the pre-processing section, the post-processing section, and the FIR Matrix. The FIR Matrix again includes the plurality of filter taps and the plurality of signal paths in signal communication with each filter tap, where the plurality of signal paths are arranged to allow re-configurable data throughput between the each filter tap. The pre-processing module and post-processing module are in signal communication with the FIR Matrix and the number of filter taps of the plurality of filter taps is predetermined.

Other devices, apparatus, systems, methods, features, and advantages of the disclosure will be or will become apparent to one with skill in the art upon examination of the following figures and detailed description. It is intended that all such additional systems, methods, features, and advantages be included within this description, be within the scope of the disclosure, and be protected by the accompanying claims.

BRIEF DESCRIPTION OF THE FIGURES

The disclosure may be better understood by referring to the following figures. The components in the figures are not necessarily to scale, emphasis instead being placed upon illustrating the principles of the disclosure. In the figures, like reference numerals designate corresponding parts throughout the different views.

DETAILED DESCRIPTION

A Scalable Finite Impulse Response ("SFIR") filter is disclosed. The SFIR filter includes a pre-processing section, a post-processing section, and a finite impulse response ("FIR") filtering matrix. The FIR Matrix includes a plurality of filter taps and a plurality of signal paths in signal communication with each filter tap. The plurality of signal paths are arranged to allow re-configurable data throughput between the each filter tap and the pre-processing module and post-processing module are in signal communication with the FIR Matrix.

Further disclosed is an Application Specific Integrated Circuit ("ASIC"). The ASIC includes the SFIR filter, where the SFIR filter includes the pre-processing section, the post-processing section, and the FIR Matrix. The FIR Matrix again includes the plurality of filter taps and the plurality of signal paths in signal communication with each filter tap, where the plurality of signal paths are arranged to allow re-configurable data throughput between the each filter tap. The pre-processing module and post-processing module are in signal communication with the FIR Matrix and the number of filter taps of the plurality of filter taps is predetermined.

Figure 1:
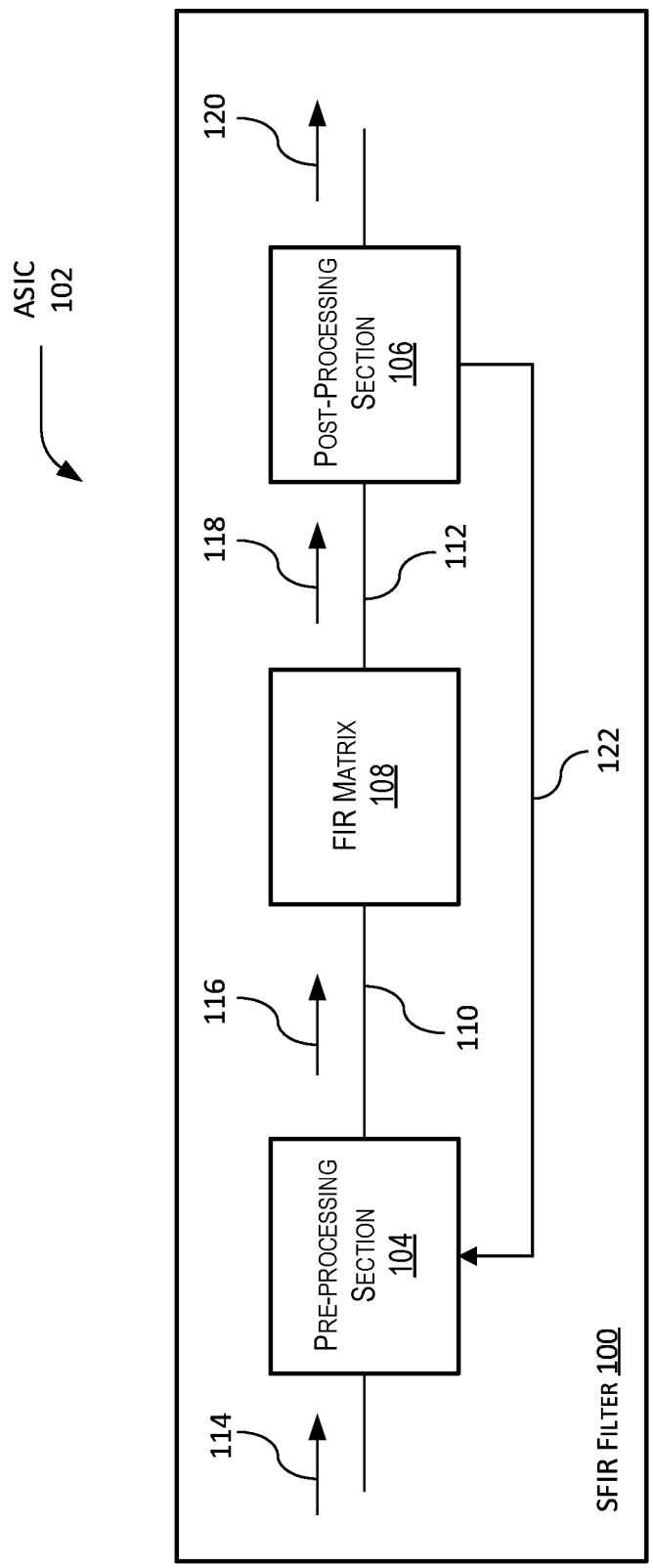
FIG. 1 is a system diagram of an example of an implementation of a Scalable Finite Impulse Response ("SFIR") filter in accordance with the present disclosure.

Specifically, in FIG. 1, a system diagram is shown of an example of an implementation of a SFIR filter 100 in accordance with the present disclosure. In this example, the SFIR filter 100 is located within an ASIC 102. The SFIR filter 100 includes a pre-processing section 104, post-processing section 106, and FIR Matrix 108. The FIR Matrix 108 is in signal communication with both the pre-processing section 104 and post-processing section 106 via signal paths 110 and 112, respectively.

In an example, of operation, the SFIR filter 100 receives an input digital signal 114 at the pre-processing section 104 that processes and organizes the data in the input digital signal 114 in an arranged order that is passed to FIR Matrix 108 via input matrix signal 116 along the signal path 110. The FIR Matrix 108 receives and filters the input matrix signal 116 and to produce an intermediate filtered output signal 118 that is passed to the post-processing section 106 via the signal path 112. The post-processing section 106 receives the intermediate filtered output signal 118 and processes and organizes the data in the intermediate filtered output signal 118 to produce the filtered output signal 120 that is passed to other devices, components, circuitry, or modules in the ASIC 102. The SFIR filter 100 also includes a loopback signal path 122 that is from the post-processing section 106 to the pre-processing section 104.

Figure 2:
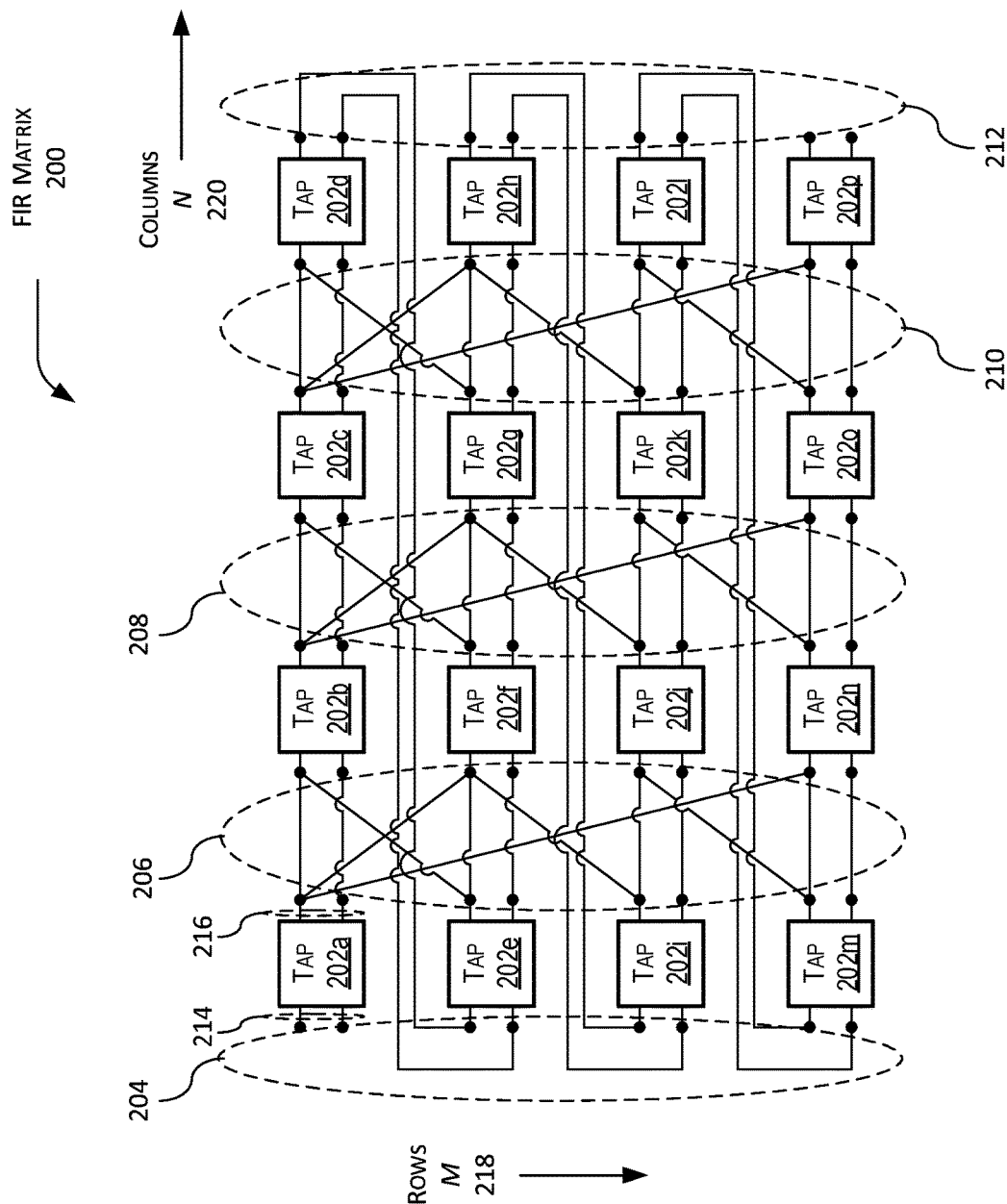
FIG. 2 is a system block diagram of an example of an implementation of a finite impulse response ("FIR") Matrix, shown in FIG. 1, in accordance with the present disclosure.

In FIG. 2, a system block diagram is shown of an example of an implementation of a FIR Matrix 200 in accordance with the present disclosure. In this example, the FIR Matrix 200 includes a plurality of filter taps 202a, 202b, 202c, 202d, 202e, 202f, 202g, 202h, 202i, 202j, 202k, 202l, 202m, 202n, 202o and 202p and a plurality of signal paths 204, 206, 208, 210, and 212 in signal communication with each filter tap of the plurality of filter taps 202a, 202b, 202c, 202d, 202e, 202f, 202g, 202h, 202i, 202j, 202k, 202l, 202m, 202n, 202o, and 202p. In this example, the plurality of signal paths 204, 206, 208, 210, and 212 are arranged and configured to allow re-configurable data throughput between the each filter tap.

For ease of illustration, in this example, only 16 filter taps 202a, 202b, 202c, 202d, 202e, 202f, 202g, 202h, 202i, 202j, 202k, 202l, 202m, 202n, 202o and 202p are shown arranged in a 4 by 4 (i.e., 4×4) matrix of filter taps. It is appreciated by those of ordinary skill in the art that the actual number of filter taps may be any number that is capable of physically fitting on the die size of the ASIC 102 based on the predetermined design of the ASIC 102. In general, the predetermined design includes at least four filter taps arranged as a two by two matrix of filter taps to a maximum number of taps arranged in an M by N matrix, where M 218 represents the number of rows of filter taps and N 220 represents the number of columns of filter taps in the matrix of filter taps 202a, 202b, 202c, 202d, 202e, 202f, 202g, 202h, 202i, 202j, 202k, 202l, 202m, 202n, 202o and 202p. The SFIR filter 100 may then be configured as a digital filter that has any arbitrary number of filter taps up to the maximum predetermined number of filter taps that is fabricated in the ASIC 102. This allows the SFIR filter 100 to be a scalable design on the ASIC 102 that is flexible similar to field programmable gate array ("FPGA") but without the limitations of high size, weight, and power ("SWAP") cost and inherent inefficiency associated with an FPGA.

As will be described later, by re-configuring the data throughput between the different filter taps 202a, 202b, 202c, 202d, 202e, 202f, 202g, 202h, 202i, 202j, 202k, 202l, 202m, 202n, 202o and 202p with the plurality of signal paths 204, 206, 208, 210, and 212, the FIR Matrix 200 may be configured to form FIR filters having different tap lengths and/or parallel FIR filters. For example, the FIR Matrix 200 may be configured to be a single serial FIR filter having up to 16 filter taps that are serially described as filter taps 202a, 202b, 202c, 202d, 202e, 202f, 202g, 202h, 202i, 202j, 202k, 202l, 202m, 202n, 202o and 202p. Alternatively, the FIR filter may be configured to be a parallel FIR filter having four parallel paths that include a first path through filter taps 202a, 202b, 202c, and 202d, a second path through filter taps 202e, 202f, 202g, and 202h, a third path through filter taps 202i, 202j, 202k, and 202l, and a fourth path through filter taps 202m, 202n, 202o, and 202p. It is appreciated that in a larger FIR Matrix 200 may more filter taps may be utilized either in a serial path or additional parallel paths based on the predetermined design and the available die space on the ASIC 102.

Also for ease of illustration, in this example, each filter tap is shown having a pair of input terminals 214 and pair of output terminals 216 in signal communication with the respective signal paths of the plurality of signal paths 204, 206, 208, 210, and 212. Specifically, in this example, the pair of input terminals 214 and pair of output terminals 216 are shown with regard to filter tap 202a but it is appreciated that each filter tap of the remaining filter taps 202b, 202c, 202d, 202e, 202f, 202g, 202h, 202i, 202j, 202k, 202l, 202m, 202n, 202o and 202p also have a corresponding pair of input terminals and pair of output terminals.

When combined with the pre-processing section 104 and post-processing section 106, the FIR Matrix 200 allow the SFIR filter 100 to be configured as different types of digital filters such as, for example, a Hilbert transform filter, decimator, interpolator, real FIR filter (i.e., a real value filter that is not a complex filter), complex FIR filter, or adaptive filter. As an example, for real FIR filter (i.e., a non-complex FIR filter), the SFIR filter 100 may include the pre-processing section configured 104 as a first pass-through device and the post-processing section 106 configured as a second pass-through device. Alternatively, in a complex FIR filter, the SFIR filter 100 includes the pre-processing section 104 configured as a fan-out device and the post-processing section 106 configured as a summation device.

If, instead, the SFIR filter 100 is configured as a decimator, the SFIR filter 100 includes the pre-processing section 104 configured as a re-order device and the post-processing section 106 configured as a summation device. Moreover, if the SFIR filter 100 is configured as an interpolator, the interpolator includes the pre-processing section 104 configured as a fan-out device and the post-processing section 106 configured as a re-order device.

It is appreciated by those skilled in the art that the circuits, components, modules, and/or devices of, or associated with, the SFIR filter 100 and ASIC 102 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

Figure 3:
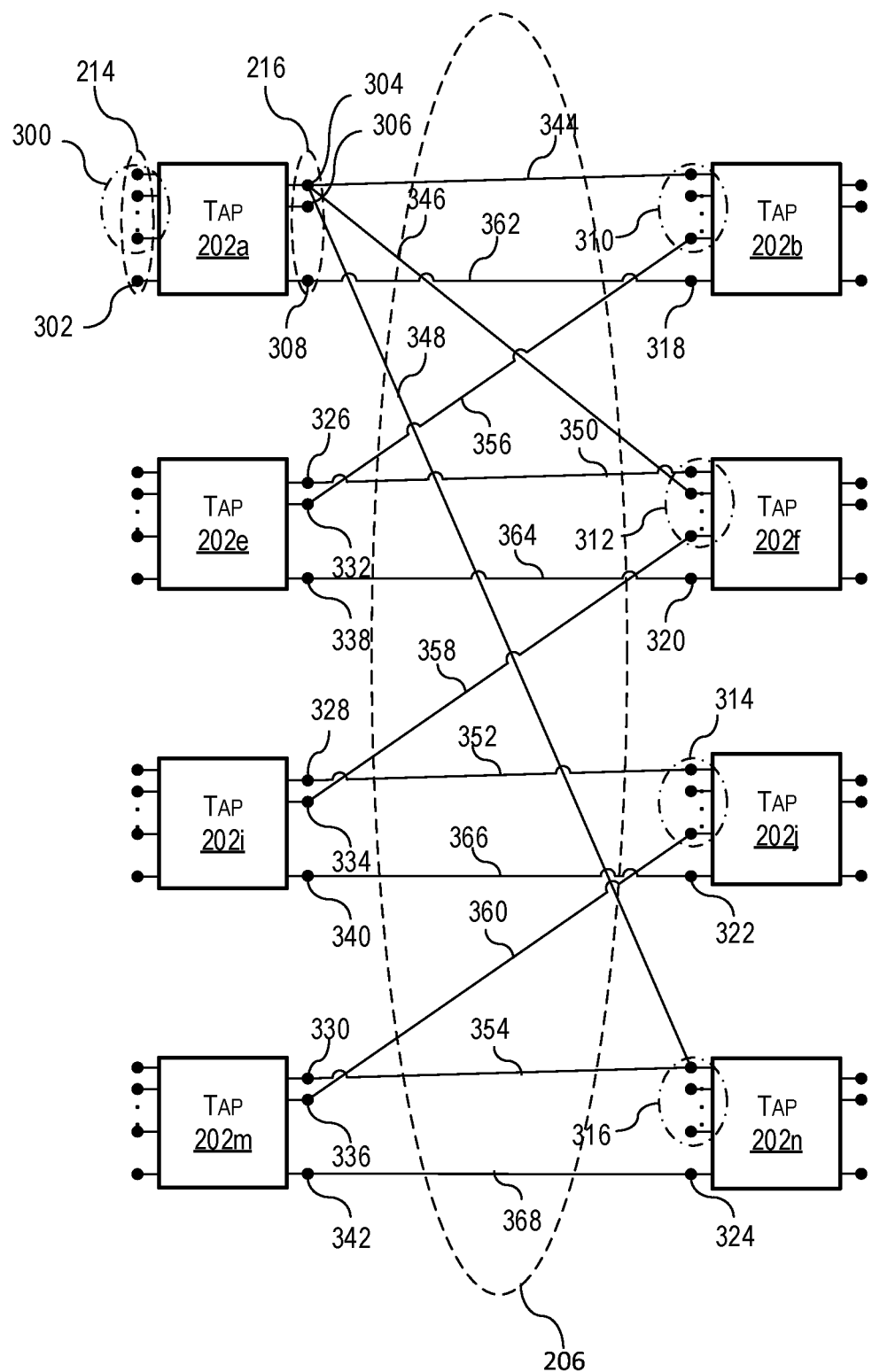
FIG. 3 is a zoomed in view of the system block diagram, illustrated in FIG. 2, in accordance with the present disclosure.

Turning to FIG. 3, a zoomed in view of the system block diagram illustrated in FIG. 2 is shown in accordance with the present disclosure. In this example, only eight (8) filter taps 202a, 202b, 202e, 202f, 202i, 202j, 202m, and 202n of the 16 filter taps 202a, 202b, 202c, 202d, 202e, 202f, 202g, 202h, 202i, 202j, 202k, 202l, 202m, 202n, 202o and 202p are shown. Moreover, the pair of input terminals 214 have a plurality of input terminals 300 and an accumulator input 302 and the pair of output terminals 216 includes a first output terminal 304, second output terminal 306, and an accumulator output 308. Additionally, each of the filter taps 202b, 202f, 202j, and 202n also includes a plurality of input terminals 310, 312, 314, and 316 and an accumulator input 318, 320, 322, and 324, respectively, similar to the plurality of input terminals 300 and accumulator input 302 of the filter tap 202a. Furthermore, each of the filter taps 202e, 202i, and 202m include a first output terminal 326, 328, and 330, second output terminal 332, 334, and 336, and an accumulator output 338, 340, and 342, respectively, similar to the first output terminal 304, second output terminal 306, and accumulator output 308 of the filter tap 202a.

In this example, the first output terminal 304 of the filter tap 202a is in signal communication with a terminal of the plurality of input terminals 310 of the filter tap 202b, a terminal of the plurality of input terminals 312 of the filter tap 202f, and a terminal of the plurality of terminals 316 of the filter tap 202n via signal paths 344, 346, and 348, respectively. The first output terminal 326 of the filter tap 202e is in signal communication with a terminal of the plurality of input terminals 312 of the filter tap 202f via signal path 350. Additionally, the first output terminal 328 of the filter tap 202i is in signal communication with a terminal of the plurality of input terminals 314 of the filter tap 202j, via signal path 352, and the first output terminal 330 of the filter tap 202m is in signal communication with a terminal of the plurality of terminals 316 of the filter tap 202n via signal path 354. In this example, the signal paths 344, 350, 352, 354, 362, 364, 366, and 368 are serial signal paths and signal paths 346, 348, 356, 358, and 360 are cross signal paths. Moreover, the serial signal paths 362, 364, 366, and 368 are adder signal paths and the cross signal paths 356, 358, and 360 are pipeline data signal paths.

The second output terminal 332 of the filter tap 202e is in signal communication with another terminal of the plurality of input terminals 310 of the filter tap 202b via signal path 356. As will be discussed later, in this example, a first pipeline data signal path 356 from a first filter first flip-flop (not shown but located within filter tap 202e) to the second filter tap second flip-flop (not shown but located within filter tap 202b) through a first filter gain section multiplier (not shown) and a first filter adder (not shown). Additionally, the second output terminal 334 of the filter tap 202i is in signal communication with another terminal of the plurality of input terminals 312 of the filter tap 202f via signal path 358. Moreover, the second output terminal 336 of the filter tap 202m is in signal communication with another terminal of the plurality of input terminals 314 of the filter tap 202j via signal path 360.

The accumulator output 308 of the filter tap 202a is in signal communication with accumulator input 318 of the filter tap 202b via signal path 362 and the accumulator output 338 of the filter tap 202e is in signal communication with accumulator input 320 of the filter tap 202f via signal path 364. Moreover, the accumulator output 340 of the filter tap 202i is in signal communication with accumulator input 322 of the filter tap 202j via signal path 366 and the accumulator output 342 of the filter tap 202m is in signal communication with accumulator input 324 of the filter tap 202n via signal path 368. In this example, the signal paths 344, 346, 348, 350, 352, 354, 356, 358, and 360 are part of the plurality of signal paths 206 shown in FIG. 2.

In general and as will be discussed later, in this example, each filter tap 202a, 202b, 202c, 202d, 202e, 202f, 202g, 202h, 202i, 202j, 202k, 202l, 202m, 202n, 202o and 202p includes a multiplexer, a first delay element in signal communication with an output of the multiplier, a gain section, a second delay element, and an adder in signal communication with both the multiplier and second flip-flop. The first and second delay elements may each be a flip-flop, such as, for example, a J-K or D flip-flop. Based on this, the plurality of input terminals 300, 310, 312, 314, and 316 are the plurality of inputs to the respective multiplexers of each of the filter taps 202a, 202b, 202f, 202j, and 202n, respectively. The first output terminal 304, 326, 328, and 330 may be a pass though signal path from the output of the multiplexers (i.e., filter tap multiplexers) in the respective filter taps 202a, 202e, 202i, and 202m. Moreover, the second output terminal 306, 332, 334, and 336 may be the output from the first delay element in the respective filter taps 202a, 202e, 202i, and 202m and the accumulation output 308, 338, 340, and 342 may be output from the adders in the respective filter taps 202a, 202e, 202i, and 202m. Furthermore, the accumulator input 302, 318, 320, 322, and 324 may be accumulation input to the respective filter taps 202a, 202b, 202f, 202j, and 202n.

It is appreciated by those of ordinary skill in the art that parallel digital filters are usually utilized to process even number of parallel paths. As such, in this example, the plurality of signal paths 206 are show communicating with an even number of paths such as filter tap 202a being in signal communication with 202b, 202f, and 202n via signal paths 344, 346, and 348 but not in signal communication with filter tap 202j. However, it is appreciated that filter tap 202a may be optionally in signal communication with the plurality of input terminals 314 for non-even applications without departing from the scope of the disclosure.

In this example, the first output terminals 304, 326, 328, and 330 and second output terminals 306, 332, 334, and 336 produce the same signal with the difference that the second output terminals 306, 332, 334, and 336 produce that same signal delayed in time versus the signal produced at the first output terminals 304, 326, 328, and 330. In other words, the signals produced at the first output terminals 304, 326, 328, and 330 may be represented as $x_n(t)$ while the signals produced at the second output terminals 306, 332, 334, and 336 may be represented as $x_n(t+1)$, where x represent the signal, n represents the parallel path, and t represent time. In general, in this example, there is no need to connect the delayed signal in the top row (i.e., second output terminal 306 of filter tap 202a) to other filter taps (e.g., filter tap 202b and others that are not shown) for applications that include serial or parallel data. Moreover, for all the other rows (i.e., the rows that include filter taps 202e and 202f, filter taps 202i and 202j, and filter taps 202m and 202n, respectively), when incoming data is introduced in parallel, the signals that are passed to the other filter taps needs to be delayed for some connections so that the data is aligned properly as it goes through the FIR Matrix 200. As such, in this example, undelayed signal produced by the first output terminals 304, 326, 328, and 330 are utilized in the first row (i.e., from filter taps 202a and 202b) and delayed signals produced by the second output terminals 306, 332, 334, and 336 are utilized in the other rows (i.e., the rows that include filter taps 202e and 202f, filter taps 202i and 202j, and filter taps 202m and 202n, respectively).

Figure 4A:
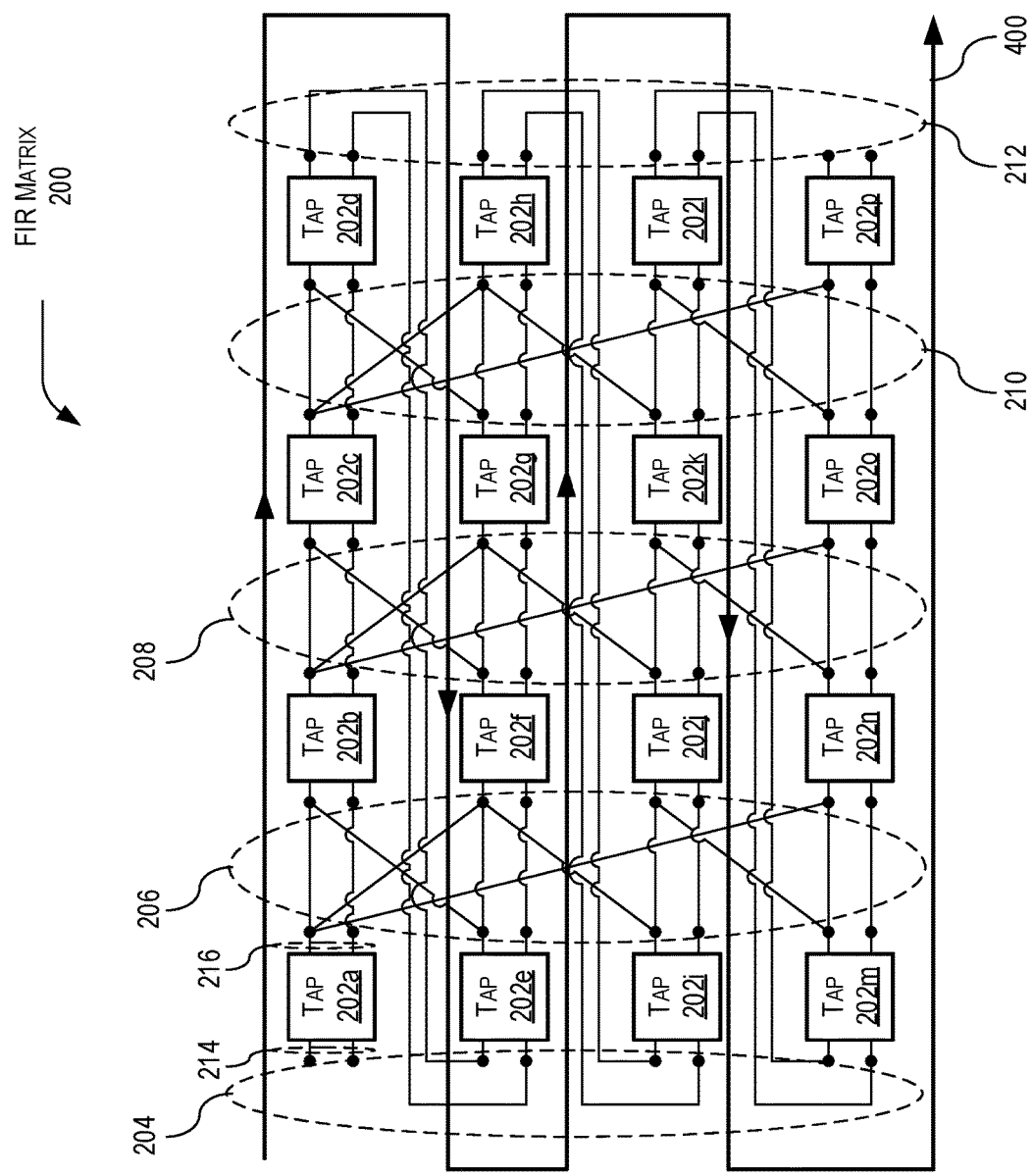
FIG. 4A is a system block diagram of an example of an implementation of a data path through the FIR Matrix (shown in FIG. 2) in accordance with the present disclosure.

In FIG. 4A, a system block diagram of an example of an implementation of a data path 400 is shown through the FIR Matrix 200 (shown in FIG. 2) in accordance with the present disclosure. In this example, the plurality of signal paths 204, 206, 208, 210, and 212 are configured such that the FIR Matrix 200 is configured as a digital filter having 16 filter taps 202a, 202b, 202c, 202d, 202e, 202f, 202g, 202h, 202i, 202j, 202k, 202l, 202m, 202n, 202o and 202p with one serial data stream of data along the data path 400. In this example, the data path 400 may be referred to a "thin pipe" of data through the SFIR filter 100. In this example, the FIR Matrix 200 has 16 filter taps that may be optionally configured from a simple one serial input four tap filter or a two parallel input two tap filter up to a serial input 16 tap filter or four parallel input four tap filter.

Figure 4B:
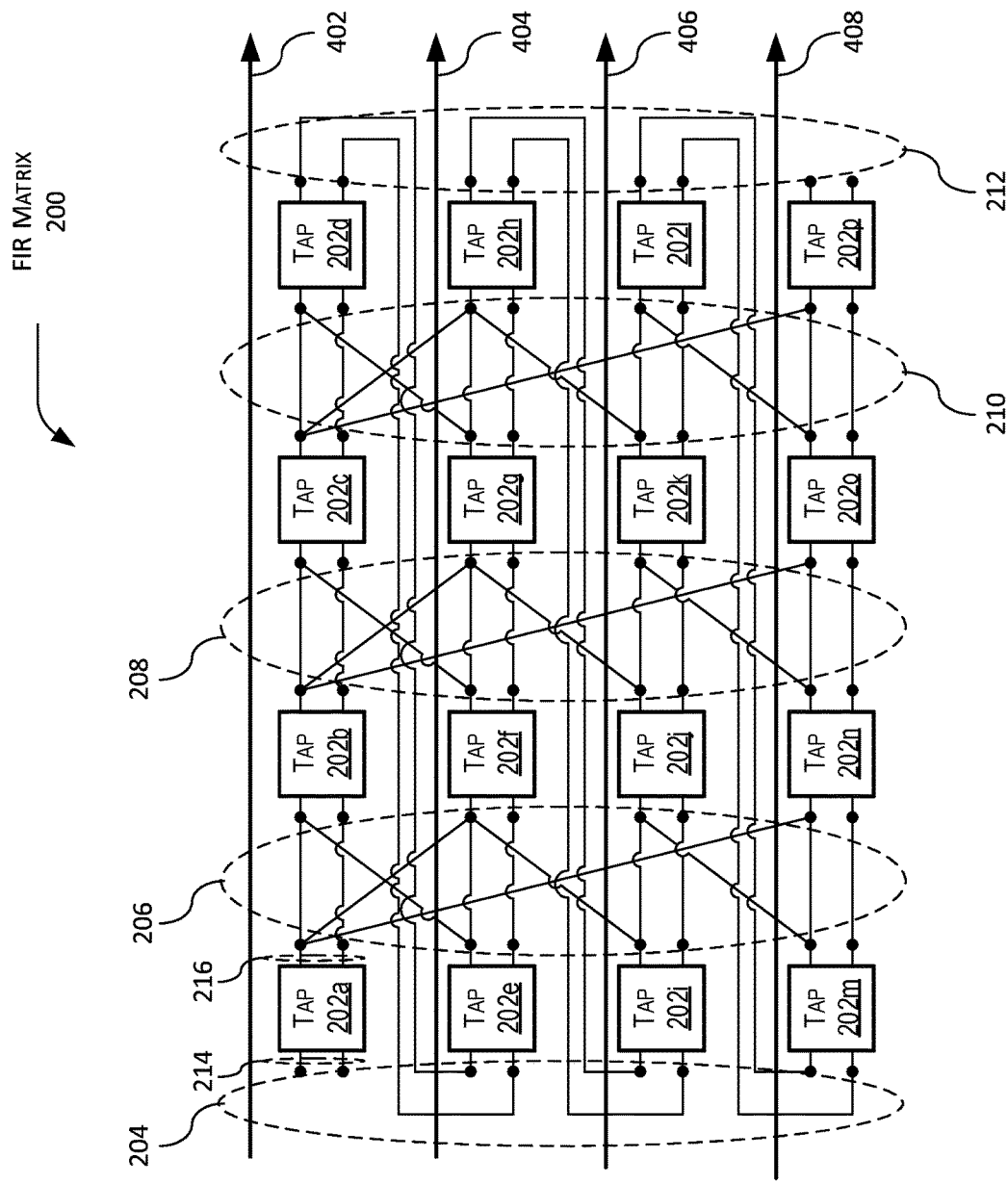
FIG. 4B is a system block diagram of an example of another implementation of four parallel data paths through the FIR Matrix (shown in FIGS. 2 and 4A) in accordance with the present disclosure.

In FIG. 4B, a system block diagram of an example of another implementation of four parallel data paths 402, 404, 406, and 408 are shown through the FIR Matrix 200 (shown in FIGS. 2 and 4A) in accordance with the present disclosure. In this example, the plurality of signal paths 204, 206, 208, 210, and 212 are configured such that the FIR Matrix 200 is configured as a digital filter having 4 filter taps along the four parallel data paths 402, 404, 406, and 408. In this example, the first parallel data path 402 is along tap filters 202a, 202b, 202c, and 202d and the second parallel data path 404 is along tap filters 202e, 202f, 202g, and 202h. The third parallel data path 406 is along tap filters 202i, 202j, 202k, and 202l and the fourth parallel data path 408 is along tap filters 202m, 202n, 202o and 202p. In this example, the first, second, third, and fourth data paths 402, 404, 406, and 408 may be referred to as a number of independent "thin pipes" of data, or a single "fat pipe" of data through the SFIR filter 100, depending on the configuration of SFIR filter 100.

Utilizing the design of the SFIR filter 100 on an ASIC 102, the SFIR filter 100 may be fabricated with an arbitrary filter length (i.e., an arbitrary number of filter taps) or real-time data throughput (i.e., the number of parallel inputs and outputs). Once fabricated, the same filter structure may be re-configured to handle differ data inputs such that, for example, the SFIR filter 100 may be re-configured to filter a small number of fat pipes or a large number of thin pipes. Likewise, the same filter structure may be re-configured to perform different filter operations such that, for example, the SFIR filter 100 may be reconfigured to provide a high number of filter taps for a low aggregate data rate, or a low number of filter taps for a high aggregate data rate. In general, interconnects formed by the plurality of signal paths 204, 206, 208, 210, and 212 between the multiplexers (in the filter taps) allow the SFIR filter 100 to be re-configured.

Figure 5:
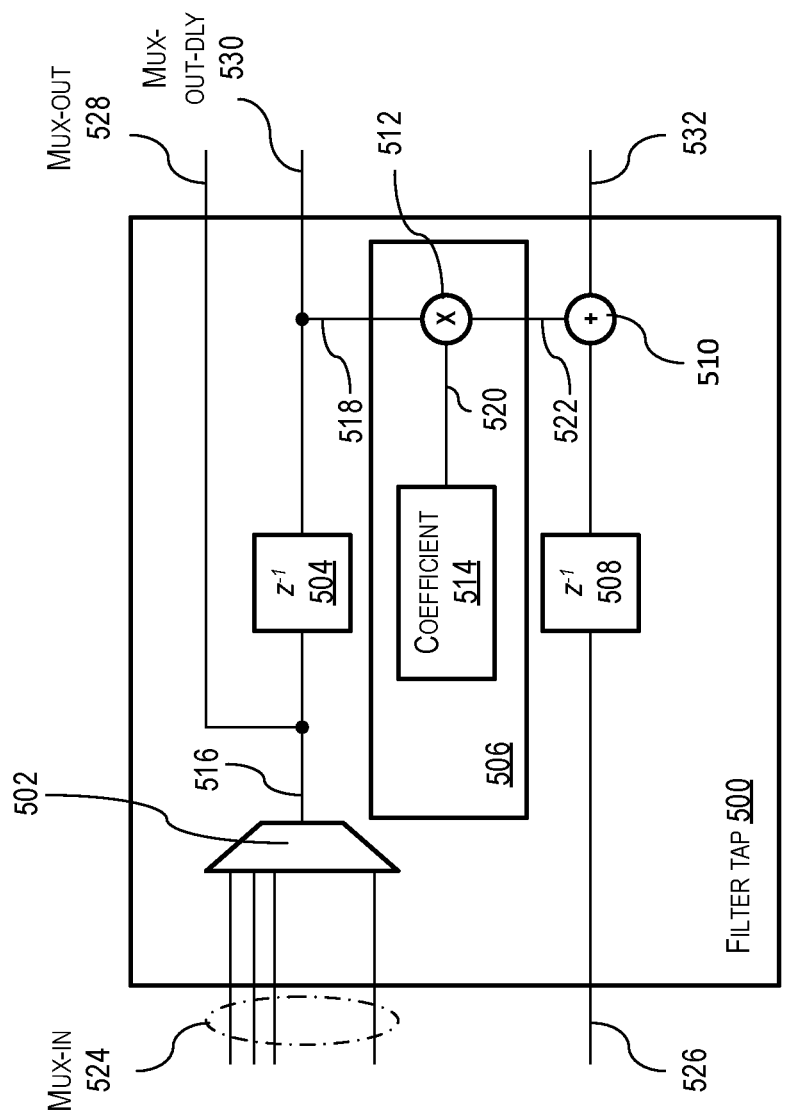
FIG. 5 is a system block diagram of an example of an implementation of a filter tap in accordance with the present disclosure.

Turning to FIG. 5, a system block diagram of an example of an implementation of a filter tap 500 is shown in accordance with the present disclosure. The filter tap 500 includes a multiplexer 502, a first delay element 504, a gain section 506, a second delay element 508, and an adder 510 (also known as a filter adder). In this example, the gain section 506 includes a gain section multiplier 512 (also referred to as a filter gain section multiplier) and a coefficient section 514. In this example, the first delay element 504 and second delay element 508 may be implemented utilizing flip-flops such as, for example, D, J-K, or R-S type flip-flops.

In these examples, the filter coefficients are preferably configurable by a user instead of being hard coded. They may be implemented, for example, utilizing registers and/or flip-flops that may be configurable by loading the registers and/or flip-flops utilizing a Network-on-Chip communication subsystem or other type of system.

In this example, the multiplexer 502 is in signal communication with the first delay element 504 via signal path 516. The gain section multiplier 512 is in signal communication with the first delay element 504, coefficient section 514, and adder 510 via signal paths 518, 520, and 522, respectively. Furthermore, the multiplexer 502 is in signal communication with the plurality of input terminals 524, the second delay element 508 is in signal communication with the accumulation input 526, the output of the multiplexer 502 is in signal communication with the first output terminal 528, the output of the first delay element 504 is in signal communication with the second output terminal 530, and the adder 510 is in signal communication with accumulator output 532.

In this example, the plurality of input terminals 524 (referred to as "mux-in"), first output terminal 528 (referred to as "mux-out"), and second output terminal 530 (referred to as "mux-out-dly") are the input to and the undelayed output of the multiplexer 502, respectively. Turning back to FIG. 2 with reference to FIG. 5, the plurality of filter taps 202a, 202b, 202c, 202d, 202e, 202f, 202g, 202h, 202i, 202j, 202k, 202l, 202m, 202n, 202o and 202p are shown as an M by N matrix, where M 218 represents the number of rows of filter taps and N 220 represents the number of columns of filter taps in the M by N matrix. In this example, the first filter tap 202a is assumed to be at a location 0, 0 (i.e., M and N both equal 0) within the M by N matrix.

Assuming that a number P represents the number of parallel path configurations in the filter tap 500, the total number of inputs to any multiplexer (e.g., the mux-in plurality of input terminals 524 to multiplexer 502) will be determined by P, where P is a non-zero positive integer equal to 1 or greater. If [(M+1)mod P]=0, then mux_in (M, N)=mux_out (M−P+1, N−1), else mux_in (M, N)=mux_out (M+1, N−1).

It is appreciated by those of ordinary skill in the art that the examples described in this disclosure are examples that utilize an even number (i.e., $2^n$) of taps and parallel paths. This has been done for simplicity of illustration but it is appreciated that the examples given will also be applicable to non-even number of taps and parallel paths since the FIR design described will be applicable to any height and width combination.

Figure 6:
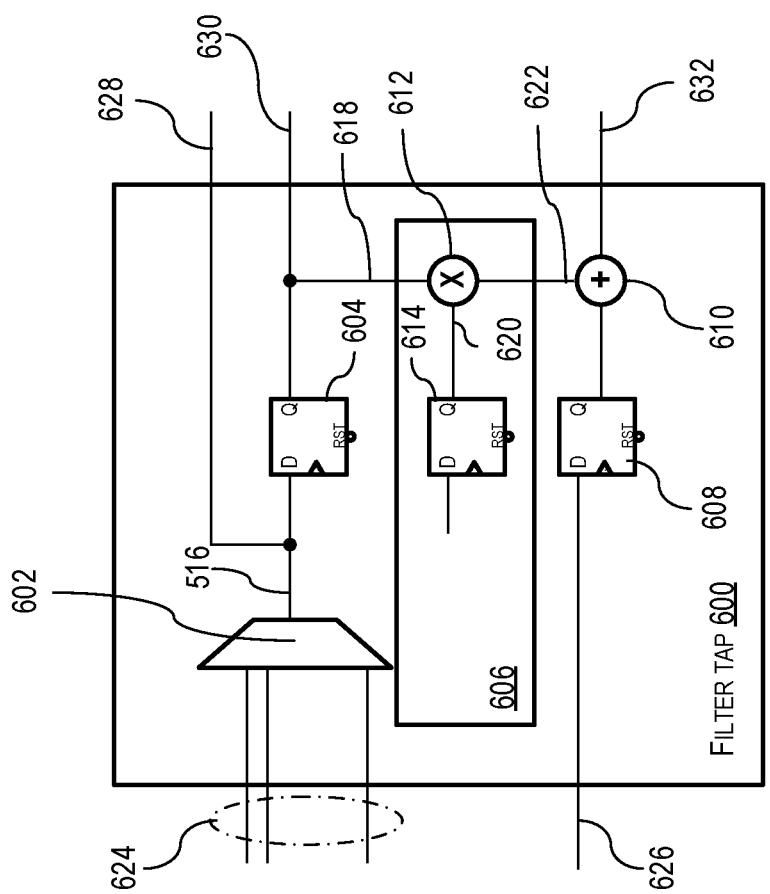
FIG. 6 is a system block diagram of an example of another implementation of a filter tap in accordance with the present disclosure.

In FIG. 6, a system block diagram of an example of another implementation of a filter tap 600 is shown in accordance with the present disclosure. As in the filter tap 500 shown in FIG. 5, the filter tap 600 includes a multiplexer 602, a first delay element 604, a gain section 606, a second delay element 608, and an adder 610. Similarly, in this example, the gain section 606 includes a gain section multiplier 612 and a coefficient section 614.

As discussed before, the multiplexer 602 is in signal communication with the first delay element 604 via signal path 516. The gain section multiplier 612 is in signal communication with the first delay element 604, coefficient section 614, and adder 610 via signal paths 618, 620, and 622, respectively. Furthermore, the multiplexer 602 is in signal communication with the plurality of input terminals 624, the second delay element 608 is in signal communication with the accumulation input 626, the output of the multiplexer 602 is in signal communication with the first output terminal 628, the output of the first delay element 604 is in signal communication with the second output terminal 630, and the adder 610 is in signal communication with accumulator output 632.

However, in this example, the first delay element 604, the second delay element 608, and coefficient section 614 are D-type flip-flops that act as data latches, where they hold or remember the data present on their data input (the "D" input shown). D-type flip-flops generally act as one-bit data latches that pass their data input based on their clock inputs. In the present disclosure, the D-type flip-flops are generally implemented as multi-bit registers. It is appreciated by those of ordinary skill in the art other types of flip-flops (such as, for example, J-K or R-S flip-flops) may also be utilized with the appropriate circuitry to support data latching.

The utilization of D-type flip-flops for the first delay element 604, the second delay element 608, and coefficient section 614 within each filter tap (i.e., every stage) of the SFIR filter 100 allow the design of the SFIR filter 100 to be scaled up to any size FIR filter desired. Additionally, the D-type flip-flops reduce routing congestion between filter taps and do not slow down the clock speeds of various configured filters within the SFIR filter 100. The D-type flip-flops for first delay element 604 and the second delay element 608 add pipelining to the ASIC 102 that allows the SFIR filter 100 to operate much quicker than known FIR techniques utilizing multiple filter taps. Specifically, the D-type flip-flops for first delay element 604 and the second delay element 608 pipelines the accumulator path (i.e., from the first delay element 604 through the gain section multiplier 612 to the adder 610) so that the maximum logic states crosses between registered elements (i.e., filter taps) is always just one multiplier and one adder. This maintains the maximum data throughput for any configured filter length. Furthermore, in a parallel filter design of the SFIR filter 100, each registered data input goes to only one multiplier regardless of filter size or configuration without having to fan-out to different multipliers as in traditional filter designs. The SFIR filter 100, as disclosed, includes built-in pipelining such that the input and output of each filter tap is in signal communication to each multiplier. This point-to-point approach allows the SFIR filter 100 to route and maintain a high achievable clock speed even as the SFIR filter 100 grows in size.

In this example, for ease of illustration and simplicity, the flip-flop implementation is shown as one-bit data latches; however, it is appreciated by those of ordinary skill in the art that in practice the flip-flops will likely be implemented as multi-bit data latches. Moreover, in practice the adder 610 may be implemented by a plurality of adders and the gain section multiplier 612 may be implemented as a plurality of gain section multipliers.

In this example, the data width of the first delay element 604 and coefficient section 614 are user defined and the data width of the second delay element 608 is driven by the bit growth through the plurality of gain section multipliers (that includes gain section multiplier 612) and the plurality of adders (that includes adder 610). Typically, the input data path through the plurality of input terminals 624, multiplexer 602, signal path 516 and first delay element 604 will be driven by a signal source such as, for example, an analog-to-digital converter ("ADC"). The coefficient section 614 will be driven by the needed filter performance, which usually needs more bits for higher performance of the filter. The accumulation path through the second delay element 608 has a data width that is equal to the data width of the first delay element 604 plus the data width of the coefficient section 614 and the base 2 logarithm ("log 2") of the number of filter taps. As an example, if the SFIR filter 100 has an 8 bit data input, 16 bit coefficients, and 16 filter taps, the data width of second delay element 608 will be equal to 8 plus 16 plus 4 that equals 28.

Figure 7:
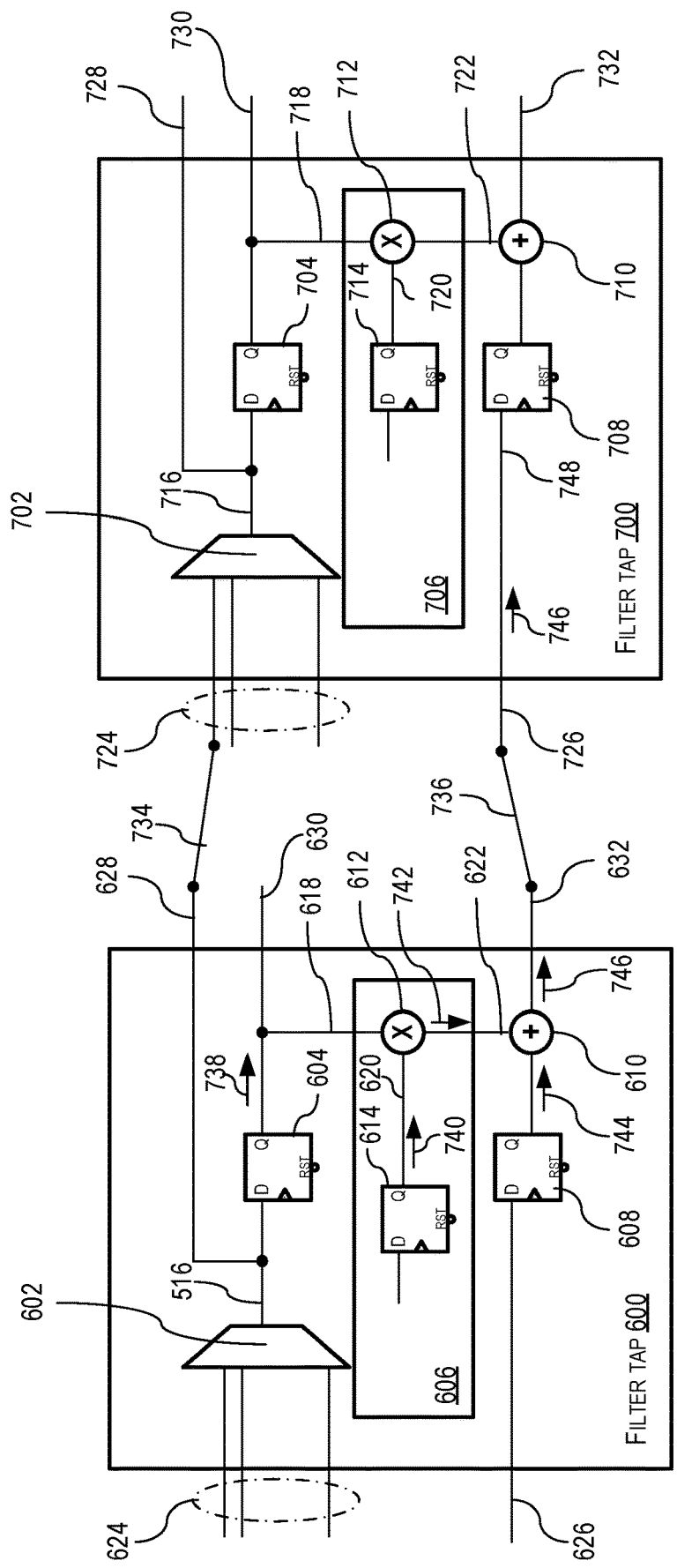
FIG. 7 is a system block diagram of an example of an implementation of pipelining two filter taps in the SFIR filter in accordance with the present disclosure.

In FIG. 7, a system block diagram of an example of an implementation of pipelining two filter taps 600 and 700 in the SFIR filter 100 is shown in accordance with the present disclosure. In this example, the filter tap 600 (shown and described in relation to FIG. 6) is shown as a first tap filter in signal communication with a second filter tap 700. Similar to the first filter tap 600, the second filter tap 700 includes a multiplexer 702, a first delay element 704, a gain section 706, a second delay element 708, and an adder 710. Similarly, in this example, the gain section 706 includes a gain section multiplier 712 and a coefficient section 714.

As discussed before, the multiplexer 702 is in signal communication with the first delay element 704 via signal path 716. The gain section multiplier 712 is in signal communication with the first delay element 704, coefficient section 714, and adder 710 via signal paths 718, 720, and 722, respectively. Furthermore, the multiplexer 702 is in signal communication with the plurality of input terminals 724, the second delay element 708 is in signal communication with the accumulation input 726, the output of the multiplexer 702 is in signal communication with the first output terminal 728, the output of the first delay element 704 is in signal communication with the second output terminal 730, and the adder 710 is in signal communication with accumulator output 732. Similar to the example in relation to FIG. 6, in this example, the first delay element 704, the second delay element 708, and coefficient section 714 are D-type flip-flops that act as data latches, where they hold or remember the data present on their data input.

In this example, the first output terminal 628 of the first filter tap 600 is in signal communication with multiplexer 702 of the second filter tap 700 via a signal path 734 and one of the terminals of the plurality of input terminals 724. Additionally, the accumulator output 632 of the first filter tap 600 is in signal communication with the second delay element 708 of the second filter tap 700 through the signal path 736 and the accumulator input 726. In other words, the signal path 736 is a first adder signal path from the adder 610 (i.e., a first filter tap adder) to the second delay element 708 (i.e., the second filter tap second flip-flop).

In an example of operation, the D-type flip-flop of the first delay element 604 of the first tap 600 produces a data value 738 at the Q-output that is multiplied, at the gain section multiplier 612, with a coefficient value 740 to produce filter output value 742 that is combined in the adder 610 with any previous accumulation value 744 to produce an accumulation value 746 that is passed to the input 748 of the D-input of the D-type flip-flop of the second delay element 708 of the second filter tap 700 via the accumulator input 726. The process would repeat to any other filter taps that are in signal communication with accumulator output 732 of the second filter tap 700.

Figure 8:
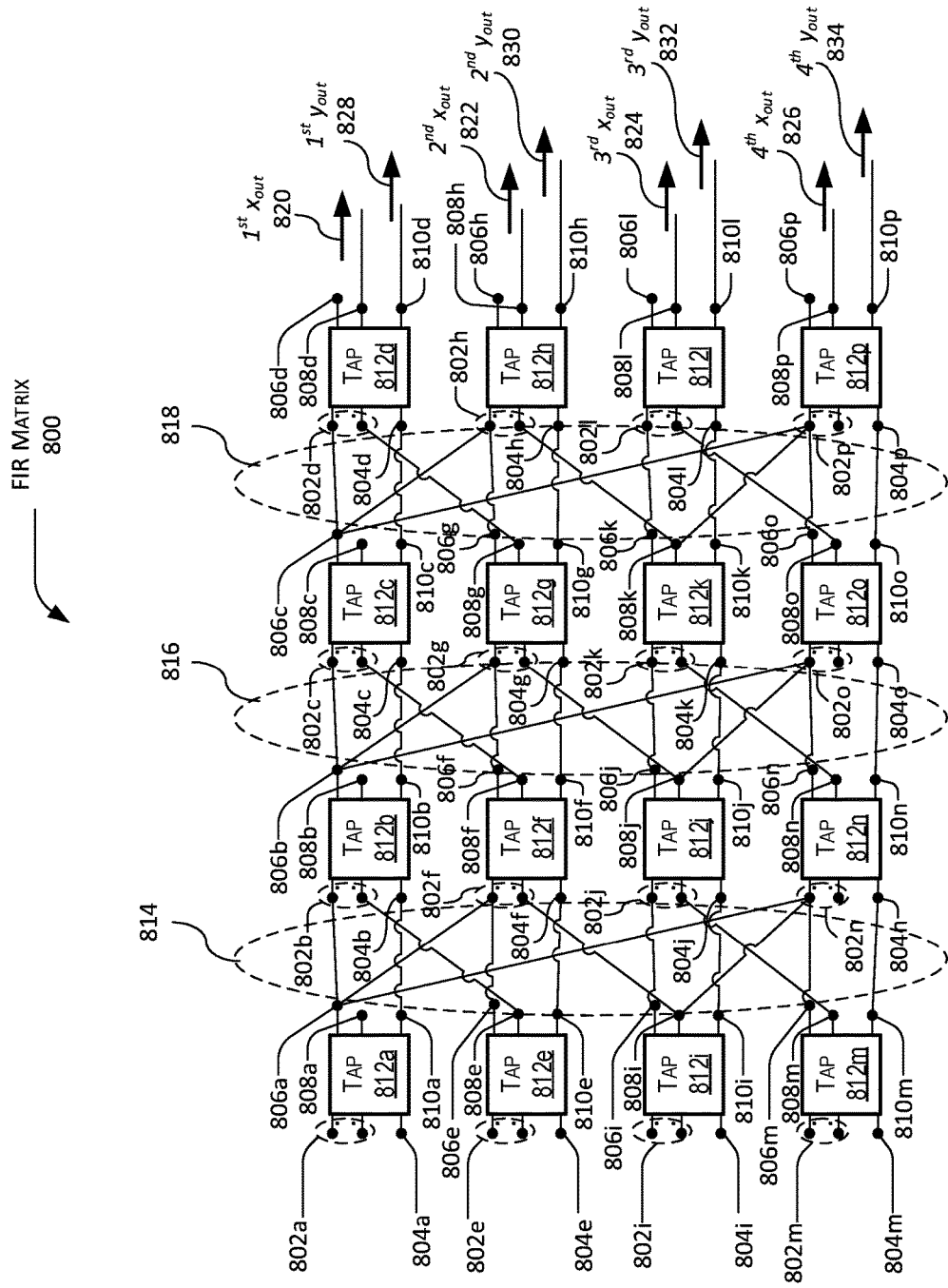
FIG. 8 is a system block diagram of an example of an implementation of FIR Matrix (shown in FIG. 2) with a plurality of input terminals, accumulator input, first output terminal, second output terminal, and accumulator output for each filter tap in accordance with the present disclosure.

Turning to FIG. 8, a system block diagram is shown of an example of an implementation of FIR Matrix 800 (shown in FIG. 2) with a plurality of input terminals 802a, 802b, 802c, 802d, 802e, 802f, 802g, 802h, 802i, 802j, 802k, 802l, 802m, 802n, 802o, and 802p, accumulator input 804a, 804b, 804c, 804d, 804e, 804f, 804g, 804h, 804i, 804j, 804k, 804l, 804m, 804n, 804o, and 804p, first output terminal 806a, 806b, 806c, 806d, 806e, 806f, 806g, 806h, 806i, 806j, 806k, 806l, 806m, 806n, 806o, and 806p, second output terminal 808a, 808b, 808c, 808d, 808e, 808f, 808g, 808h, 808i, 808j, 808k, 808l, 808m, 808n, 808o, and 808p, and accumulator output 810a, 810b, 810c, 810d, 810e, 810f, 810g, 810h, 810i, 810j, 810k, 810l, 810m, 810n, 810o, and 810p for each filter tap 812a, 812b, 812c, 812d, 812e, 812f, 812g, 812h, 812i, 812j, 812k, 812l, 812m, 812n, 812o, and 812p in accordance with the present disclosure. In this example, it is assumed that every filter tap 812a, 812b, 812c, 812d, 812e, 812f, 812g, 812h, 812i, 812j, 812k, 812l, 812m, 812n, 812o, and 812p includes a first delay element 604 flip-flop, gain section 606, and second delay element 608 flip-flop as shown and described in relation to FIG. 6. Similar to the examples shown in relation to FIGS. 2, 4A, and 4B, the filter taps are in signal communication with each other via the plurality of signal paths 814, 816, and 818, respectively.

In this example, the following tables (Tables 1 through 6) of filter element values for FIR Matrix 800 performing four parallel processing paths are described for five clock cycles (i.e., clock cycles 0 through 5). Additionally, in this example, the following signal path connections are assumed.

The first output terminal 806a (for example, the first output terminal 528 shown in FIG. 5) of filter tap 812a is in signal communication with an input terminal of the plurality of input terminals 802b (for example, the plurality of input terminals 524 shown in FIG. 5) at filter tap 812b, an input terminal of the plurality of input terminals 802f at filter tap 812f, and an input terminal of the plurality of input terminals 802n at filter tap 812n. The first output terminal 806b of filter tap 812b is in signal communication with an input terminal of the plurality of input terminals 802c at filter tap 812c, an input terminal of the plurality of input terminals 802g at filter tap 812g, and an input terminal of the plurality of input terminals 802o at filter tap 812o. The first output terminal 806c of filter tap 812c is in signal communication with an input terminal of the plurality of input terminals 802d at filter tap 812d, an input terminal of the plurality of input terminals 802h at filter tap 812h, and an input terminal of the plurality of input terminals 802p at filter tap 812p. The accumulator output 810a (for example, the accumulator output 532 shown in FIG. 5) of filter tap 812a is in signal communication an accumulator input 804b (for example, accumulator input 526 shown in FIG. 5) at filter tap 812b. Additionally, the accumulator output 810b of filter tap 812b is in signal communication an accumulator input 804c at filter tap 812c and the accumulator output 810c of filter tap 812c is in signal communication an accumulator input 804d at filter tap 812d.

The first output terminal 806e of filter tap 812e is in signal communication with an input terminal of the plurality of input terminals 802f at filter tap 812f. The second output terminal 808e (for example, second output terminal 530 shown in FIG. 5) of filter tap 812e is in signal communication with another input terminal of the plurality of input terminals 802b at filter tap 812b. The first output terminal 806f of filter tap 812f is in signal communication with an input terminal of the plurality of input terminals 802g at filter tap 812g. The second output terminal 808f of filter tap 812f is in signal communication with another input terminal of the plurality of input terminals 802c at filter tap 812c. The first output terminal 806g of filter tap 812g is in signal communication with an input terminal of the plurality of input terminals 802h at filter tap 812h. The second output terminal 808g of filter tap 812g is in signal communication with another input terminal of the plurality of input terminals 802d at filter tap 812d. The accumulator output 810e of filter tap 812e is in signal communication an accumulator input 804f at filter tap 812f. Additionally, the accumulator output 810f of filter tap 812f is in signal communication an accumulator input 804g at filter tap 812g and the accumulator output 810g of filter tap 812g is in signal communication an accumulator input 804h at filter tap 812h.

The first output terminal 806i of filter tap 812i is in signal communication with an input terminal of the plurality of input terminals 802j at filter tap 812j. The second output terminal 808i of filter tap 812i is in signal communication with another input terminal of the plurality of input terminals 802f at filter tap 812f. The first output terminal 806j of filter tap 812j is in signal communication with an input terminal of the plurality of input terminals 802k at filter tap 812k. The second output terminal 808j of filter tap 812j is in signal communication with another input terminal of the plurality of input terminals 802g at filter tap 812g. The first output terminal 806k of filter tap 812k is in signal communication with an input terminal of the plurality of input terminals 802*l* at filter tap 812*l*. The second output terminal 808*k* of filter tap 812*k* is in signal communication with another input terminal of the plurality of input terminals 802*h* at filter tap 812*h*. The accumulator output 810*i* of filter tap 812*i* is in signal communication an accumulator input 804*j* at filter tap 812*j*. Additionally, the accumulator output 810*j* of filter tap 812*j* is in signal communication an accumulator input 804*k* at filter tap 812*k* and the accumulator output 810*k* of filter tap 812*k* is in signal communication an accumulator input 804*l* at filter tap 812*l*.

The first output terminal 806*m* of filter tap 812*m* is in signal communication with an input terminal of the plurality of input terminals 802*n* at filter tap 812*n*. The second output terminal 808*m* of filter tap 812*m* is in signal communication with another input terminal of the plurality of input terminals 802*j* at filter tap 812*j*. The first output terminal 806*n* of filter tap 812*n* is in signal communication with an input terminal of the plurality of input terminals 802*o* at filter tap 812*o*. The second output terminal 808*n* of filter tap 812*n* is in signal communication with another input terminal of the plurality of input terminals 802*k* at filter tap 812*k*. The first output terminal 806*o* of filter tap 812*o* is in signal communication with an input terminal of the plurality of input terminals 802*p* at filter tap 812*p*. The second output terminal 808*o* of filter tap 812*o* is in signal communication with another input terminal of the plurality of input terminals 802*l* at filter tap 812*l*. The accumulator output 810*m* of filter tap 812*m* is in signal communication an accumulator input 804*n* at filter tap 812*n*. Additionally, the accumulator output 810*n* of filter tap 812*n* is in signal communication an accumulator input 804*o* at filter tap 812*o* and the accumulator output 810*o* of filter tap 812*o* is in signal communication an accumulator input 804*p* at filter tap 812*p*.

In this example, the x value outputs (i.e., $x_{out}$) of the last filter tap (i.e., filter taps 812*d*, 812*h*, 812*l*, and 812*p*) of the parallel paths through the FIR Matrix 800 are shown as first $x_{out}$ 820, second $x_{out}$ 822, third $x_{out}$ 824, and fourth $x_{out}$ 826. These values correspond to the values stored within the first delay elements (e.g., flip-flops) in the respective last filter tap. Similarly, the y value outputs (i.e., $y_{out}$) of the last filter tap of the parallel paths through the FIR Matrix 800 are shown as first $y_{out}$ 828, second $y_{out}$ 830, third $y_{out}$ 832, and fourth $y_{out}$ 834. These values correspond to the values produced by the adder within (e.g., adder 510 in FIG. 5) the respective last filter tap.

It is appreciated by those of ordinary skill in the art that the general relationship for a FIR filter is described as follows:

$$y_n = \sum_{i=0}^{N} c_i * x_{n-i},$$

where the value $x_n$ is the input values to the FIR filter, N is the filter order (i.e., designates the total number of filter taps), $c_i$ is the impulse response at $i^{th}$ instant for $0 \leq i \leq N$ of the $N^{th}$ order FIR filter that corresponds to the FIR filter coefficient values, and $y_n$ is the output value of the FIR filter. In this example, values $x_0$ through $x_{19}$ are the FIR Matrix 800 filter input values, the values $x_i$ represent the sequential samples in time of the same data stream where, in this example, the data throughput of the FIR filter is four samples per clock, and the values $c_0$ through $c_3$ are the filter coefficient values. For simplicity, only values $x_0$ through $x_{19}$ are called out in the tables below. As described earlier, the variable $x_{out}$ is the value of the first delay element in the last filter tap in the parallel paths (i.e., filter taps 812*d*, 812*h*, 812*l*, and 812*p*, respectively). The variable $y_{out}$ is the accumulation output values of the parallel paths at the last filter tap (i.e., filter taps 812*d*, 812*h*, 812*l*, and 812*p*) in respective the parallel path.

TABLE 1 for Clock Cycle 0

| Element\Filter Tap | Tap 812a | Tap 812b | Tap 812c | Tap 812d |
|---|---|---|---|---|
| Input to filter tap | $x_0$ | | | |
| Output of Multiplexer | $x_0$ | | | |
| $1^{st}$ delay element | | | | |
| $2^{nd}$ delay element before adder | | | | |

| Element\Filter Tap | Tap 812e | Tap 812f | Tap 812g | Tap 812h |
|---|---|---|---|---|
| Input to filter tap | $x_1$ | | | |
| Output of Multiplexer | $x_1$ | | | |
| $1^{st}$ delay element | | | | |
| $2^{nd}$ delay element before adder | | | | |

| Element\Filter Tap | Tap 812i | Tap 812j | Tap 812k | Tap 812l |
|---|---|---|---|---|
| Input to filter tap | $x_2$ | | | |
| Output of Multiplexer | $x_2$ | | | |
| $1^{st}$ delay element | | | | |
| $2^{nd}$ delay element before adder | | | | |

| Element\Filter Tap | Tap 812m | Tap 812n | Tap 812o | Tap 812p |
|---|---|---|---|---|
| Input to filter tap | $x_3$ | $x_0$ | | |
| Output of Multiplexer | $x_3$ | $x_0$ | | |
| $1^{st}$ delay element | | | | |
| $2^{nd}$ delay element before adder | | | | |

TABLE 2 for Clock Cycle 1

| Element\Filter Tap | Tap 812a | Tap 812b | Tap 812c | Tap 812d |
|---|---|---|---|---|
| Input to filter tap | $x_4$ | $x_4, x_1$ | $x_1$ | |
| Output of Multiplexer | $x_4$ | $x_1$ | | |
| $1^{st}$ delay element | $x_0$ | | | |
| $2^{nd}$ delay element before adder | | | | |

| Element\Filter Tap | Tap 812e | Tap 812f | Tap 812g | Tap 812h |
|---|---|---|---|---|
| Input to filter tap | $x_5$ | $x_4, x_5, x_2$ | $x_1, x_2$ | |
| Output of Multiplexer | $x_5$ | $x_2$ | | |
| $1^{st}$ delay element | $x_1$ | | | |
| $2^{nd}$ delay element before adder | | | | |

| Element\Filter Tap | Tap 812i | Tap 812j | Tap 812k | Tap 812l |
|---|---|---|---|---|
| Input to filter tap | $x_6$ | $x_6, x_3$ | $x_3, x_0$ | |
| Output of Multiplexer | $x_6$ | $x_3$ | | |
| $1^{st}$ delay element | $x_2$ | | | |
| $2^{nd}$ delay element before adder | | | | |

| Element\Filter Tap | Tap 812m | Tap 812n | Tap 812o | Tap 812p |
|---|---|---|---|---|
| Input to filter tap | $x_7$ | $x_4, x_6, x_7$ | $x_1, x_3, x_4$ | |
| Output of Multiplexer | $x_7$ | $x_4$ | $x_1$ | |
| $1^{st}$ delay element | $x_3$ | $x_0$ | | |
| $2^{nd}$ delay element before adder | | | | |

TABLE 3 for Clock Cycle 2

| Element\Filter Tap | Tap 812a | Tap 812b | Tap 812c | Tap 812d |
|---|---|---|---|---|
| Input to filter tap | $x_8$ | $x_8, x_5$ | $x_5, x_2$ | |
| Output of Multiplexer | $x_8$ | $x_5$ | $x_2$ | |
| 1$^{st}$ delay element | $x_4$ | $x_1$ | | |
| 2$^{nd}$ delay element before adder | | $x_0*c_0$ | | |

| Element\Filter Tap | Tap 812e | Tap 812f | Tap 812g | Tap 812h |
|---|---|---|---|---|
| Input to filter tap | $x_9$ | $x_8, x_9, x_6$ | $x_5, x_6, x_3$ | $x_2, x_3, x_0$ |
| Output of Multiplexer | $x_9$ | $x_6$ | $x_3$ | $x_0$ |
| 1$^{st}$ delay element | $x_5$ | $x_2$ | | |
| 2$^{nd}$ delay element before adder | | $x_1*c_0$ | | |

| Element\Filter Tap | Tap 812i | Tap 812j | Tap 812k | Tap 812l |
|---|---|---|---|---|
| Input to filter tap | $x_{10}$ | $x_{10}, x_7$ | $x_7, x_4$ | $x_4, x_1$ |
| Output of Multiplexer | $x_{10}$ | $x_7$ | $x_4$ | $x_1$ |
| 1$^{st}$ delay element | $x_6$ | $x_3$ | $x_0$ | |
| 2$^{nd}$ delay element before adder | | $x_2*c_0$ | | |

| Element\Filter Tap | Tap 812m | Tap 812n | Tap 812o | Tap 812p |
|---|---|---|---|---|
| Input to filter tap | $x_{11}$ | $x_8, x_{10}, x_{11}$ | $x_5, x_7, x_8$ | $x_2, x_4, x_5$ |
| Output of Multiplexer | $x_{11}$ | $x_8$ | $x_5$ | $x_2$ |
| 1$^{st}$ delay element | $x_7$ | $x_4$ | $x_1$ | |
| 2$^{nd}$ delay element before adder | | $x_3*c_0$ | | |

TABLE 4 for Clock Cycle 3

| Element\Filter Tap | Tap 812a | Tap 812b | Tap 812c | Tap 812d |
|---|---|---|---|---|
| Input to filter tap | $x_{12}$ | $x_{12}, x_9$ | $x_9, x_6$ | $x_6, x_3$ |
| Output of Multiplexer | $x_{12}$ | $x_9$ | $x_6$ | $x_3$ |
| 1$^{st}$ delay element | $x_8$ | $x_5$ | $x_2$ | |
| 2$^{nd}$ delay element before adder | | $x_4*c_0$ | $x_0*c_0 + x_1*c_1$ | |

| Element\Filter Tap | Tap 812e | Tap 812f | Tap 812g | Tap 812h |
|---|---|---|---|---|
| Input to filter tap | $x_{13}$ | $x_{12}, x_{13}, x_{10}$ | $x_9, x_{10}, x_7$ | $x_6, x_7, x_4$ |
| Output of Multiplexer | $x_{13}$ | $x_{10}$ | $x_7$ | $x_4$ |
| 1$^{st}$ delay element | $x_9$ | $x_6$ | $x_3$ | $x_0$ |
| 2$^{nd}$ delay element before adder | | $x_5*c_0$ | $x_1*c_0 + x_2*c_1$ | |

| Element\Filter Tap | Tap 812i | Tap 812j | Tap 812k | Tap 812l |
|---|---|---|---|---|
| Input to filter tap | $x_{14}$ | $x_{14}, x_{11}$ | $x_{11}, x_8$ | $x_8, x_5$ |
| Output of Multiplexer | $x_{14}$ | $x_{11}$ | $x_8$ | $x_5$ |
| 1$^{st}$ delay element | $x_{10}$ | $x_7$ | $x_4$ | $x_1$ |
| 2$^{nd}$ delay element before adder | | $x_6*c_0$ | $x_2*c_0 + x_3*c_1$ | |

| Element\Filter Tap | Tap 812m | Tap 812n | Tap 812o | Tap 812p |
|---|---|---|---|---|
| Input to filter tap | $x_{15}$ | $x_{12}, x_{14}, x_{15}$ | $x_9, x_{11}, x_{12}$ | $x_6, x_8, x_9$ |
| Output of Multiplexer | $x_{15}$ | $x_{12}$ | $x_9$ | $x_6$ |
| 1$^{st}$ delay element | $x_{11}$ | $x_8$ | $x_5$ | $x_2$ |
| 2$^{nd}$ delay element before adder | | $x_7*c_0$ | $x_3*c_0 + x_4*c_1$ | |

TABLE 5 for Clock Cycle 4

| Element\Filter Tap | Tap 812a | Tap 812b | Tap 812c | Tap 812d |
|---|---|---|---|---|
| Input to filter tap | $x_{16}$ | $x_{16}, x_{13}$ | $x_{13}, x_{10}$ | $x_{10}, x_7$ |
| Output of Multiplexer | $x_{16}$ | $x_{13}$ | $x_{10}$ | $x_7$ |
| 1$^{st}$ delay element | $x_{12}$ | $x_9$ | $x_6$ | $x_3$ |
| 2$^{nd}$ delay element before adder | | $x_8*c_0$ | $x_4*c_0 + x_5*c_1$ | $x_0*c_0 + x_1*c_1 + x_2*c_2$ |

| Element\Filter Tap | Tap 812e | Tap 812f | Tap 812g | Tap 812h |
|---|---|---|---|---|
| Input to filter tap | $x_{17}$ | $x_{16}, x_{17}, x_{14}$ | $x_{13}, x_{14}, x_{11}$ | $x_{10}, x_{11}, x_8$ |
| Output of Multiplexer | $x_{17}$ | $x_{14}$ | $x_{11}$ | $x_8$ |
| 1$^{st}$ delay element | $x_{13}$ | $x_{10}$ | $x_7$ | $x_4$ |
| 2$^{nd}$ delay element before adder | | $x_9*c_0$ | $x_5*c_0 + x_6*c_1$ | $x_1*c_0 + x_2*c_1 + x_3*c_2$ |

| Element\Filter Tap | Tap 812i | Tap 812j | Tap 812k | Tap 812l |
|---|---|---|---|---|
| Input to filter tap | $x_{18}$ | $x_{18}, x_{15}$ | $x_{15}, x_{12}$ | $x_{12}, x_9$ |
| Output of Multiplexer | $x_{18}$ | $x_{15}$ | $x_{12}$ | $x_9$ |
| 1$^{st}$ delay element | $x_{14}$ | $x_{11}$ | $x_8$ | $x_5$ |
| 2$^{nd}$ delay element before adder | | $x_{10}*c_0$ | $x_6*c_0 + x_7*c_1$ | $x_2*c_0 + x_3*c_1 + x_4*c_2$ |

| Element\Filter Tap | Tap 812m | Tap 812n | Tap 812o | Tap 812p |
|---|---|---|---|---|
| Input to filter tap | $x_{19}$ | $x_{16}, x_{18}, x_{19}$ | $x_{13}, x_{15}, x_{16}$ | $x_{10}, x_{12}, x_{13}$ |
| Output of Multiplexer | $x_{19}$ | $x_{16}$ | $x_{13}$ | $x_{10}$ |
| 1$^{st}$ delay element | $x_{15}$ | $x_{12}$ | $x_9$ | $x_6$ |
| 2$^{nd}$ delay element before adder | | $x_{11}*c_0$ | $x_7*c_0 + x_8*c_1$ | $x_3*c_0 + x_4*c_1 + x_5*c_2$ |

TABLE 6 for Clock Cycle 5

| Element\Filter Tap | Tap 812a | Tap 812b | Tap 812c | Tap 812d |
|---|---|---|---|---|
| Input to filter tap | | $x_{17}$ | $x_{17}, x_{14}$ | $x_{14}, x_{11}$ |
| Output of Multiplexer | | $x_{17}$ | $x_{14}$ | $x_{11}$ |
| 1$^{st}$ delay element | $x_{16}$ | $x_{13}$ | $x_{10}$ | $x_7$ |
| 2$^{nd}$ delay element before adder | | $x_{12}*c_0$ | $x_8*c_0 + x_9*c_1$ | $x_4*c_0 + x_5*c_1 + x_6*c_2$ |
| First $x_{out}$ 820 | | | | $x_3$ |
| First $y_{out}$ 828 | | | | $x_0*c_0 + x_1*c_1 + x_2*c_2 + x_3*c_3$ |

| Element\Filter Tap | Tap 812e | Tap 812f | Tap 812g | Tap 812h |
|---|---|---|---|---|
| Input to filter tap | | $x_{18}$ | $x_{17}, x_{18}, x_{15}$ | $x_{14}, x_{15}, x_{12}$ |
| Output of Multiplexer | | $x_{18}$ | $x_{15}$ | $x_{12}$ |
| 1$^{st}$ delay element | $x_{17}$ | $x_{14}$ | $x_{11}$ | $x_8$ |
| 2$^{nd}$ delay element before adder | | $x_{13}*c_0$ | $x_9*c_0 + x_{10}*c_1$ | $x_5*c_0 + x_6*c_1 + x_7*c_2$ |
| Second $x_{out}$ 822 | | | | $x_4$ |
| Second $y_{out}$ 830 | | | | $x_1*c_0 + x_2*c_1 + x_3*c_2 + x_4*c_3$ |

| Element\Filter Tap | Tap 812i | Tap 812j | Tap 812k | Tap 812l |
|---|---|---|---|---|
| Input to filter tap | | $x_{19}$ | $x_{19}, x_{16}$ | $x_{16}, x_{13}$ |
| Output of Multiplexer | | $x_{19}$ | $x_{16}$ | $x_{13}$ |

TABLE 6-continued for Clock Cycle 5

| 1st delay element | $x_{18}$ | $x_{15}$ | $x_{12}$ | $x_9$ |
|---|---|---|---|---|
| 2nd delay element before adder | | $x_{14}*c_0$ | $x_{10}*c_0 +$ $x_{11}*c_1$ | $x_6*c_0 +$ $x_7*c_1 +$ $x_8*c_2$ |
| Third $x_{out}$ 824 Third $y_{out}$ 832 | | | | $x_5$ $x_2*c_0 +$ $x_3*c_1 +$ $x_4*c_2 +$ $x_5*c_3$ |

| Element\Filter Tap | Tap 812m | Tap 812n | Tap 812o | Tap 812p |
|---|---|---|---|---|
| Input to filter tap | | | $x_{17}, x_{19}$ | $x_{14}, x_{16},$ $x_{17}$ |
| Output of Multiplexer | | | $x_{17}$ | $x_{14}$ |
| 1st delay element | $x_{19}$ | $x_{16}$ | $x_{13}$ | $x_{10}$ |
| 2nd delay element before adder | | $x_{15}*c_0$ | $x_{11}*c_0 +$ $x_{12}*c_1$ | $x_7*c_0 +$ $x_8*c_1 +$ $x_9*c_2$ |
| Fourth $x_{out}$ 826 Fourth $y_{out}$ 834 | | | | $x_6$ $x_3*c_0 +$ $x_4*c_1 +$ $x_5*c_2 +$ $x_6*c_3$ |

Figure 9:
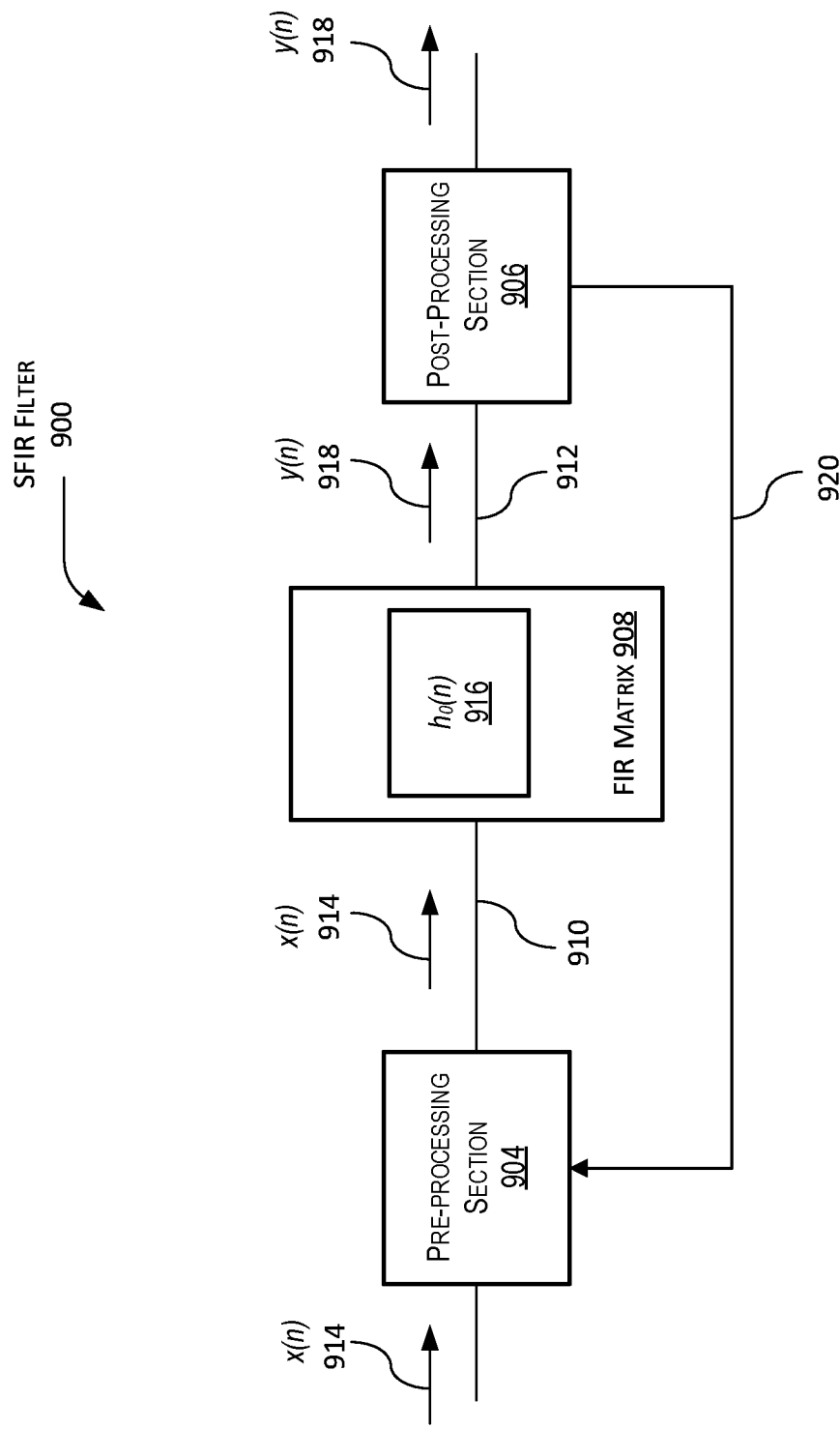
FIG. 9 is a system block diagram of an example of an implementation of a real (i.e., non-complex) FIR filter in the SFIR filter in accordance with the present disclosure.

Turning to FIG. 9, a system block diagram of an example of an implementation of a real (i.e., non-complex) FIR filter in the SFIR filter 900 is shown in accordance with the present disclosure. In this example, the SFIR filter 900 includes a pre-processing section 904, post-processing section 906, and FIR Matrix 908. The FIR Matrix 908 is in signal communication with both the pre-processing section 904 and post-processing section 906 via signal paths 910 and 912, respectively. The filter input x(n) 914 is input into the pre-processing section 904 and is passed directly to the FIR Matrix 908. The FIR Matrix 908 is configured as a standard real value FIR filter 916 having a transfer function of $h_0(n)$. The FIR filter 916 receives the filter input x(n) 914 filters it and outputs an filter output y(n) 918 that is passed to the post-processing section 906. The post-processing section 906 then passes the filter output y(n) 918 without processing it. The post-processing section 906 is also in signal communication with pre-processing section 904 via a loopback signal path 920 that is utilized to pass data back to the pre-processing section 904.

Figure 10:
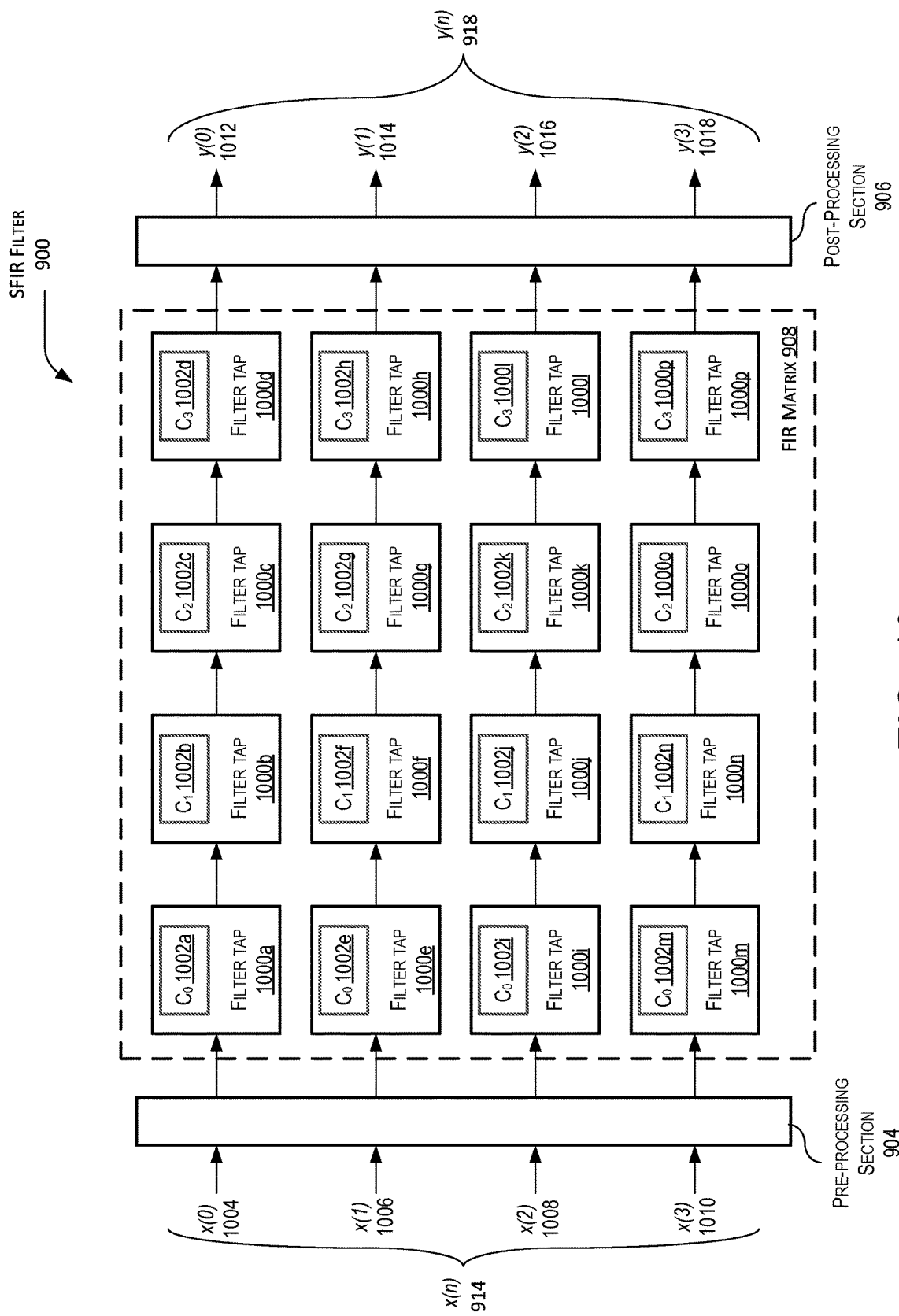
FIG. 10 is a system block diagram of an example of an implementation of the coefficient values utilized by the SFIR filter in accordance with the present disclosure.

In FIG. 10, a system block diagram of an example of an implementation of the coefficient values utilized by the SFIR filter 900 is shown in accordance with the present disclosure. In this example, the FIR Matrix 908, for purposes of illustration, is shown to be a 4 by 4 filter matrix similar to the examples described earlier with regards to FIGS. 2, 4A, 4B, and 8. As such, the FIR Matrix 908 includes 16 filter taps 1000a, 1000b, 1000c, 1000d, 1000e, 1000f, 1000g, 1000h, 1000i, 1000j, 1000k, 1000l, 1000m, 1000n, 1000o, and 1000p having filter coefficients $C_0$ 1002a, $C_1$ 1002b, $C_2$ 1002c, $C_3$ 1002d, $C_0$ 1002e, $C_1$ 1002f, $C_2$ 1002g, $C_3$ 1002h, $C_0$ 1002i, $C_1$ 1002j, $C_2$ 1002k, $C_3$ 10021, $C_0$ 1002m, $C_1$ 1002n, $C_2$ 1002o, and $C_3$ 1002p.

As described in relation to FIG. 9, the SFIR filter 900 receives the filter input x(n) 914 that is shown as parallel input values of x(0) 1004, x(1) 1006, x(2) 1008, and x(3) 1010 and produces the filter output y(n) 918 that is shown as parallel output values of y(0) 1012, y(1) 1014, y(2) 1016, and y(3) 1018, respectively.

It is appreciated that the column values of the filter coefficients are the same for the four paths since the SFIR filter 900 is configured as a real value parallel FIR filter having four parallel paths. As such, the filter coefficients $C_0$ 1002a, $C_0$ 1002e, $C_0$ 1002i, and $C_0$ 1002m are the same and equal to the value of filter coefficient $C_0$. Similarly, filter coefficients $C_1$ 1002b, $C_1$ 1002f, $C_1$ 1002j, and $C_1$ 1002n are the same and equal to the value of filter coefficient $C_1$, filter coefficients $C_2$ 1002c, $C_2$ 1002g, $C_2$ 1002k, and $C_2$ 1002o are the same and equal to the value of filter coefficient $C_2$, and filter coefficients $C_3$ 1002d, $C_3$ 1002h, $C_3$ 10021, and $C_3$ 1002p are the same and equal to the value of filter coefficient $C_3$.

Figure 11:
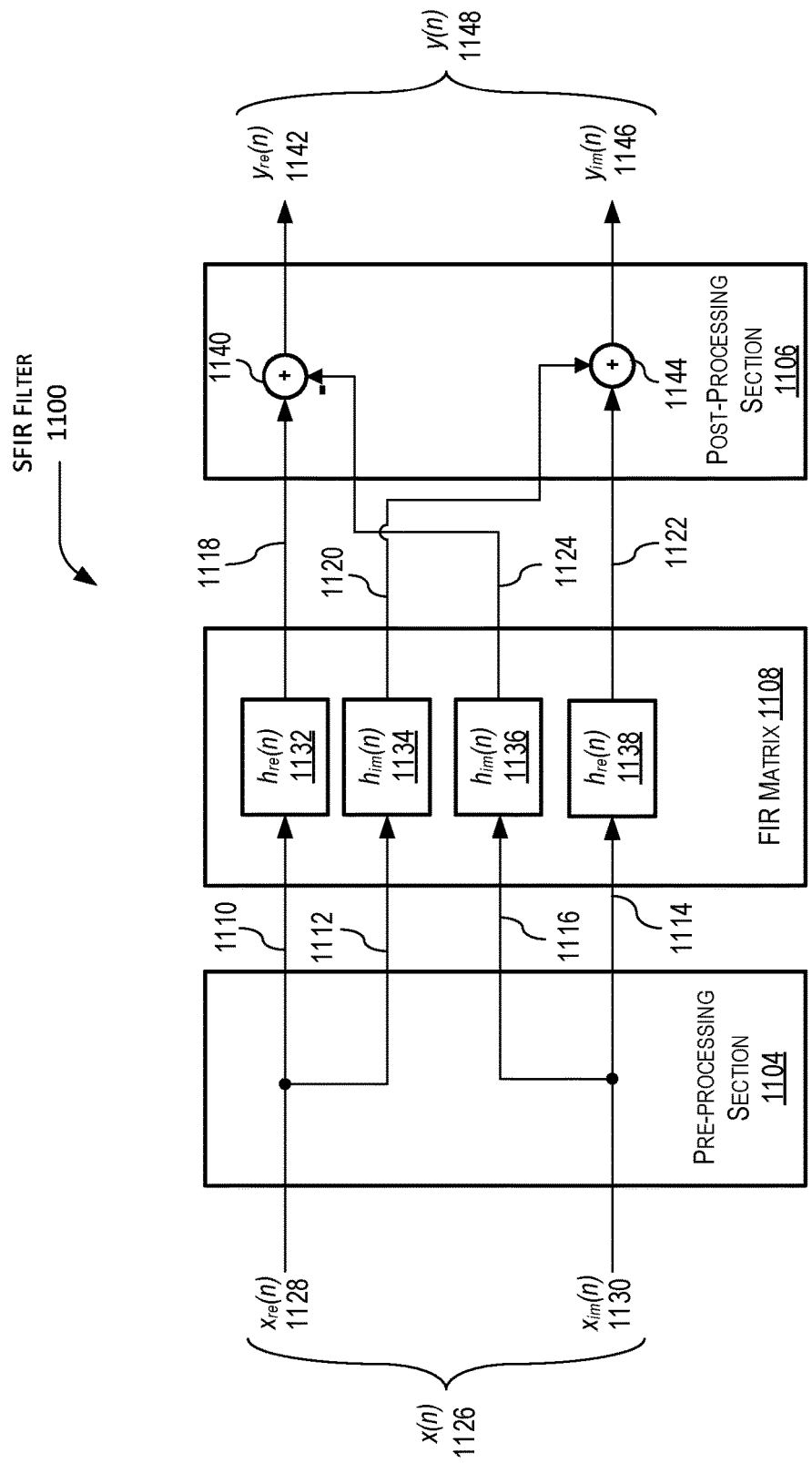
FIG. 11 is a system block diagram of an example of an implementation of a complex FIR filter in the SFIR filter in accordance with the present disclosure.

In FIG. 11, a system block diagram of an example of an implementation of a complex FIR filter in the SFIR filter 1100 is shown in accordance with the present disclosure. In this example, the SFIR filter 1100 includes a pre-processing section 1104, post-processing section 1106, and FIR Matrix 1108. The FIR Matrix 1108 is in signal communication with both the pre-processing section 1104 and post-processing section 1106 via signal paths 1110, 1112, 1114, 1116, 1118, 1120, 1122, and 1124, respectively.

The filter input x(n) 1126 is input into the pre-processing section 1104, where the filter input x(n) 1126 includes a filter input real component $x_{re}(n)$ 1128 and a filter input imaginary component $x_{im}(n)$ 1130 because in this example the filter input x(n) 1126 is a complex data signal. The filter input real component $x_{re}(n)$ 1128 is passed to the FIR Matrix 1108 via signal paths 1110 and 1112 and the filter input imaginary component $x_{im}(n)$ 1130 is passed to the FIR Matrix 1108 via signal paths 1114 and 1116. The FIR Matrix 1108 is configured as a complex value FIR filter having four FIR sub-filters 1132, 1134, 1136, and 1138 having transfer functions of $h_{re}(n)$ and $h_{im}(n)$, respectively.

In this example, the FIR sub-filter 1132 receives the filter input real component $x_{re}(n)$ 1128, filters it, and outputs a first portion of a filter output that is passed to a first adder 1140 within the post-processing section 1106. Simultaneously, the FIR sub-filter 1136 receives the filter input imaginary component $x_{im}(n)$ 1130, filters it, and outputs a second portion of the filter output that is passed to the first adder 1140. The second portion of a filter output may be complemented (i.e., converted into an opposite value) within the post-processing section 1106 so as to cause the first adder 1140 to subtract the second portion of the filter output from the first portion of the filter output to produce a filter output real component $y_{re}(n)$ 1142.

Moreover, the FIR sub-filter 1134 receives the filter input real component $x_{re}(n)$ 1128, filters it, and outputs an third portion of a filter output that is passed to a second adder 1144 within the post-processing section 1106. Simultaneously, the FIR sub-filter 1138 receives the filter input imaginary component $x_{im}(n)$ 1130, filters it, and outputs an fourth portion of the filter output that is passed to the second adder 1144. The second adder 1144 adds the third portion of the filter output to the fourth portion of the filter output to produce a filter output imaginary component $y_{im}(n)$ 1146. The filter output real component and filter output imaginary component may be combined in a single complex data signal referred to as filter output y(n) 1148.

Figure 12:
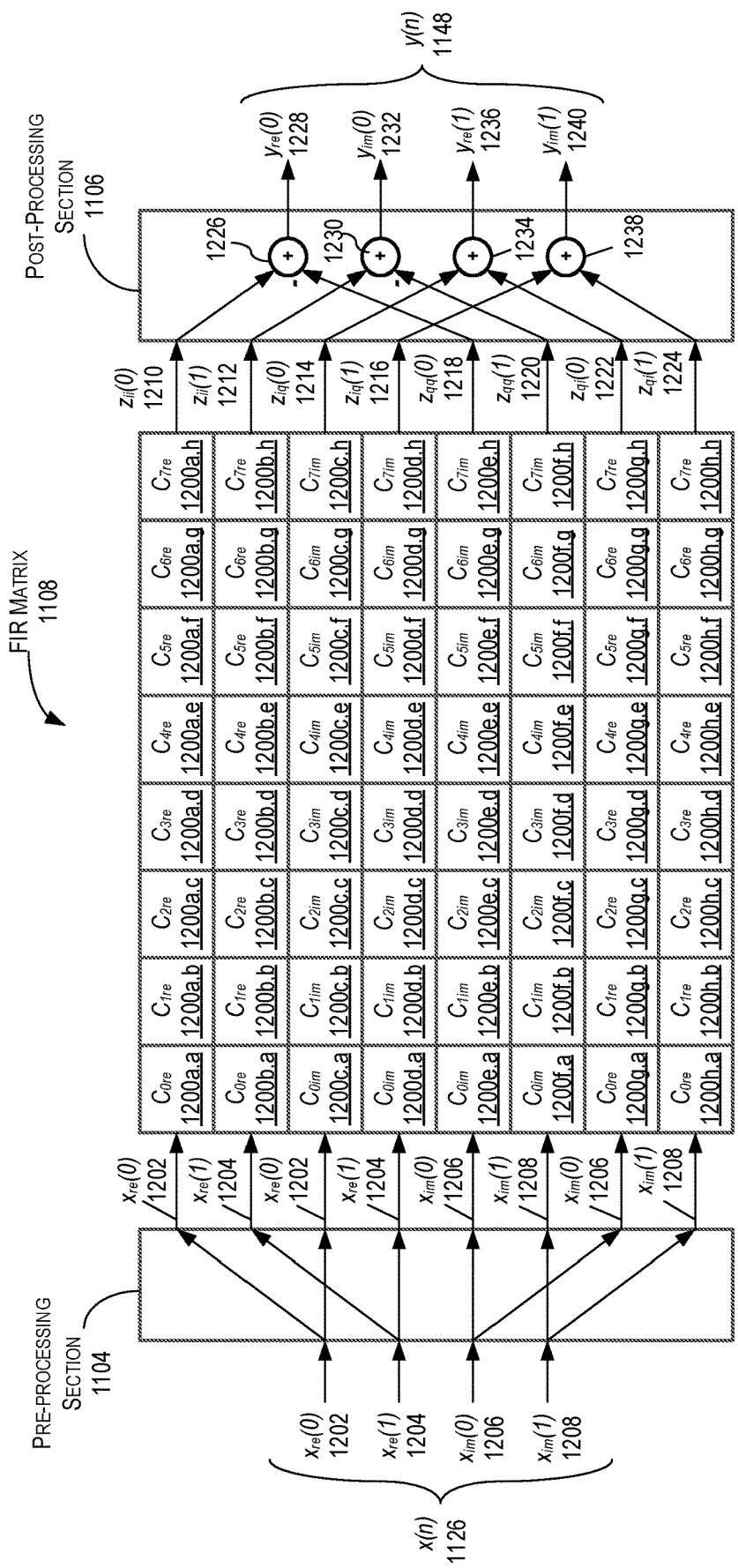
FIG. 12 is a system block diagram of an example of an implementation of the coefficient values utilized by the SFIR filter in accordance with the present disclosure.

In FIG. 12, a system block diagram of an example of an implementation of the coefficient values utilized by the SFIR filter 1100 is shown in accordance with the present disclosure. In this example, the FIR Matrix 1108, for purposes of illustration, is shown to be an 8 by 8 filter matrix. As such, the FIR Matrix 1108 includes 64 filter taps 1200a,a, 1200a,b, 1200a,c, 1200a,d, 1200a,e, 1200a,f, 1200a,g, 1200a,h, 1200b,a, 1200b,b, 1200b,c, 1200b,d, 1200b,e, 1200b,f, 1200b,g, 1200b,h, 1200c,a, 1200c,b, 1200c,c, 1200c,d, 1200c,e, 1200c,f, 1200c,g, 1200c,h, 1200d,a, 1200d,b, $1200d,c$, $1200d,d$, $1200d,e$, $1200d,f$, $1200d,g$, $1200d,h$, $1200e,a$, $1200e,b$, $1200e,c$, $1200e,d$, $1200e,e$, $1200e,f$, $1200e,g$, $1200e,h$, $1200f,a$, $1200f,b$, $1200f,c$, $1200f,d$, $1200f,e$, $1200f,f$, $1200f,g$, $1200f,h$, $1200g,a$, $1200g,b$, $1200g,c$, $1200g,d$, $1200g,e$, $1200g,f$, $1200g,g$, $1200g,h$, $1200h,a$, $1200h,b$, $1200h,c$, $1200h,d$, $1200h,e$, $1200h,f$, $1200gh,g$, and $1200h,h$ having filter coefficients $C_{0re}$, $C_{1re}$, $C_{2re}$, $C_{3re}$, $C_{4re}$, $C_{5re}$, $C_{6re}$, $C_{7re}$, $C_{0im}$, $C_{1im}$, $C_{2im}$, $C_{3im}$, $C_{4im}$, $C_{5im}$, $C_{6im}$, and $C_{7im}$, respectively.

In this example, the SFIR filter 1100 receives two complex input signal that are input into the pre-processing section 1104 as four real value input signals herein referred to as a first real input $x_{re}(0)$ 1202 and a second real input $x_{re}(1)$ 1204 and a first imaginary input $x_{im}(0)$ 1206 and an imaginary phase input $x_{im}(1)$ 1208. These signals are re-ordered and fanned out by the pre-processing section 1104 and feed into the FIR Matrix 1108, where the first real input $x_{re}(0)$ 1202 is input into the filter taps 1200a,a and 1200c,a, the second real input $x_{re}(1)$ 1204 is input into the filter taps 1200b,a and 1200d,a, the first imaginary input $x_{im}(0)$ 1206 is input into the filter taps 1200e,a and 1200g,a, and the second imaginary input $x_{im}(1)$ 1208 is input into the filter taps 1200f,a and 1200h,a.

The FIR Matrix 1108 then produces the intermediate outputs $z_{ii}(0)$ 1210, $z_{ii}(1)$ 1212, $z_{iq}(0)$ 1214, $z_{iq}(1)$ 1216, $z_{qq}(0)$ 1218, $z_{qq}(1)$ 1220, $z_{qi}(0)$ 1222, and $z_{qi}(1)$ 1224 that are passed to the post-processing section 1106. For simplicity of illustration, the subscript notation of the variables z have been changed to "i" for real instead of "re" and "q" for imaginary for "im," since placing subscripts "im" and "re" or "re" and "im" would be confusing. As such, the subscripts for the variable z will be "$z_{ii}$" instead of "$z_{rere}$," "$z_{iq}$" instead of "$z_{reim}$," "$z_{qi}$" instead of "$z_{imre}$," and "$z_{qq}$" instead of "$z_{imim}$."

As such, the post-processing section 1106 then combines the intermediate outputs $z_{ii}(0)$ 1210 with $z_{qq}(0)$ 1218 at a first adder 1226 to produce a first complex filter output signal $y_{re}(0)$ 1228 and $z_{ii}(1)$ 1212 with $z_{qq}(1)$ 1220 at a second adder 1230 to produce a second complex filter output signal $y_{im}(0)$ 1232. In this example, the intermediate outputs $z_{qq}(0)$ 1218 and $z_{qq}(1)$ 1220 may be complimented to produce opposite values such that the first adder 1226 and second adder 1230 produce subtractions between $z_{ii}(0)$ 1210 with $z_{qq}(0)$ 1218 and $y_{re}(0)$ 1228 and $z_{ii}(1)$ 1212, respectively. Furthermore, the post-processing section 1106 then also combines the intermediate outputs $z_{iq}(0)$ 1214 with $z_{qi}(0)$ 1222 at a third adder 1234 to produce a third complex filter output signal $y_{re}(1)$ 1236 and combines the intermediate $z_{iq}(1)$ 1216 with $z_{qi}(1)$ 1224 at a fourth adder 1238 to produce a fourth complex filter output signal $y_q(1)$ 1240.

Figure 13:
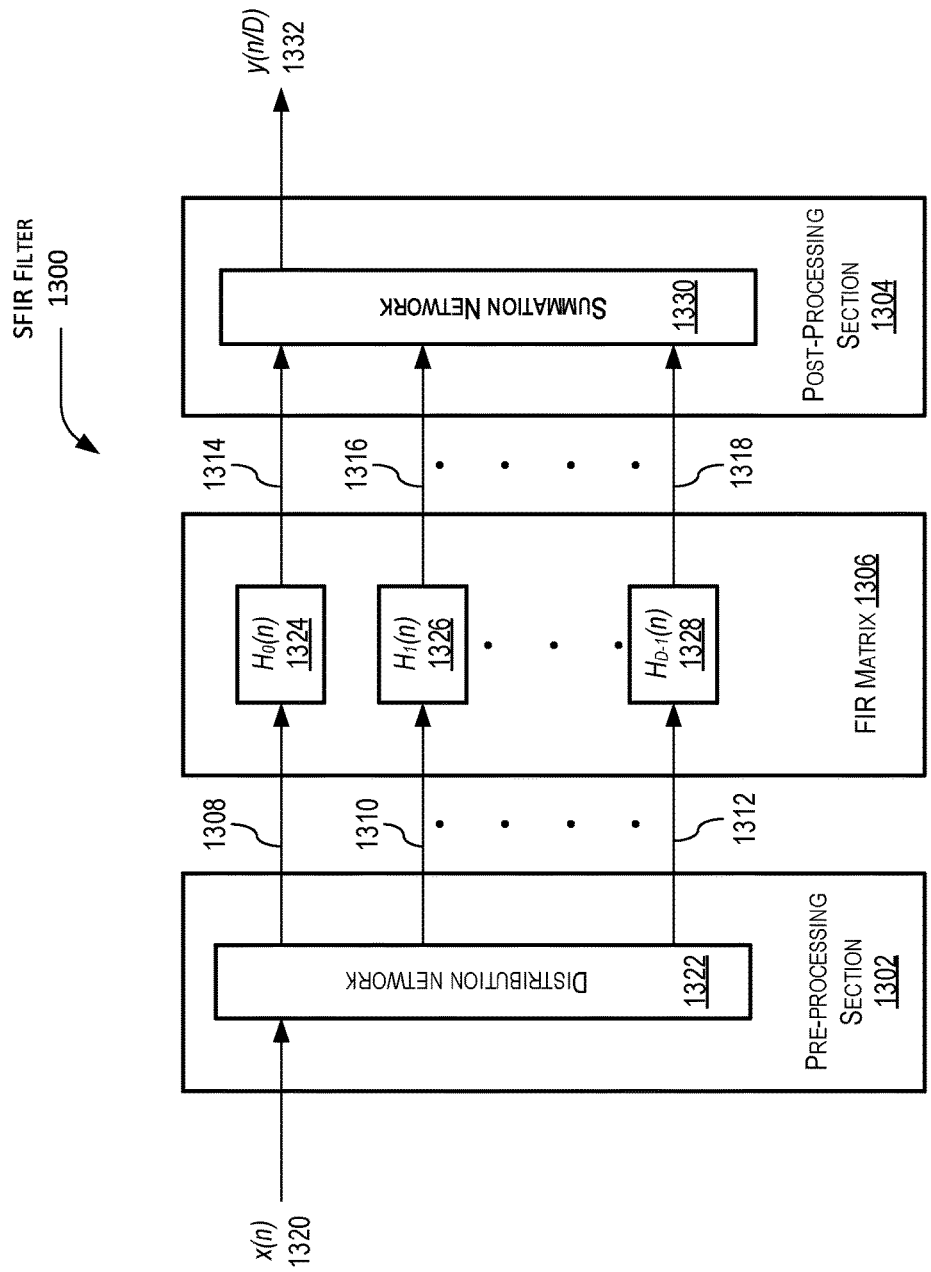
FIG. 13 is a system block diagram of an example of an implementation of a decimator in the SFIR filter in accordance with the present disclosure.

In FIG. 13, a system block diagram of an example of an implementation of a decimator in the SFIR filter 1300 is shown in accordance with the present disclosure. As before, in this example, the SFIR filter 1300 includes a pre-processing section 1302, post-processing section 1304, and FIR Matrix 1306. The FIR Matrix 1306 is in signal communication with both the pre-processing section 1302 and post-processing section 1304 via signal paths 1308, 1310, 1312, 1314, 1316, and 1318, respectively.

In this example, the pre-processing section 1302 receives the filter input $x(n)$ 1320. The pre-processing section 1302 is configured, in this example, as a distribution network 1322 that re-orders the filter input $x(n)$ 1320 and feeds the FIR sub-filters 1324, 1326, and 1328, respectively. The FIR sub-filters 1324, 1326, and 1328 have the corresponding transfer functions $H_0(n)$, $H_1(n)$, and $H_{D-1}(n)$, where D represents the number of FIR sub-filters present in the FIR Matrix 1306.

In this example, the first FIR sub-filter 1324 is in signal communication with the distribution network 1322 via signal path 1308, the second FIR sub-filter 1326 is in signal communication with the distribution network 1322 via signal path 1310, and the third FIR sub-filter 1328 is in signal communication with the distribution network 1322 via signal path 1312. The post-processing section 1304 is configured as a summation network 1330 that adds the outputs of the FIR sub-filters 1324, 1326, and 1328. The first FIR sub-filter 1324 is in signal communication with the summation network 1330 via signal path 1314, the second FIR sub-filter 1326 is in signal communication with the summation network 1330 via signal path 1316, and the third FIR sub-filter 1328 is in signal communication with the summation network 1330 via signal path 1318.

In an example of operation, the first FIR sub-filter 1324 receives a filter input from the distribution network 1322, filters it, and outputs a first portion of a filter output that is passed to the summation network 1330. Simultaneously: the second FIR sub-filter 1326 receives a filter input from the distribution network 1322, filters it, and outputs a first portion of a filter output that is passed to the summation network 1330; and the third FIR sub-filter 1328 receives a filter input from the distribution network 1322, filters it, and outputs a first portion of a filter output that is passed to the summation network 1330. The outputs from the FIR sub-filters 1324, 1326, and 1328 are received by the summation network 1330 and combined (i.e., added together) to produce a filter output $y(n/D)$ 1332, where the filter input $x(n)$ 1320 has n number of inputs and the filter output $y(n/D)$ 1332 has n/D outputs. As such, in this example, the n number of inputs in the filter input $x(n)$ 1320 are decimated into n/D outputs of the filter output $y(n/D)$ 1332.

Figure 14:
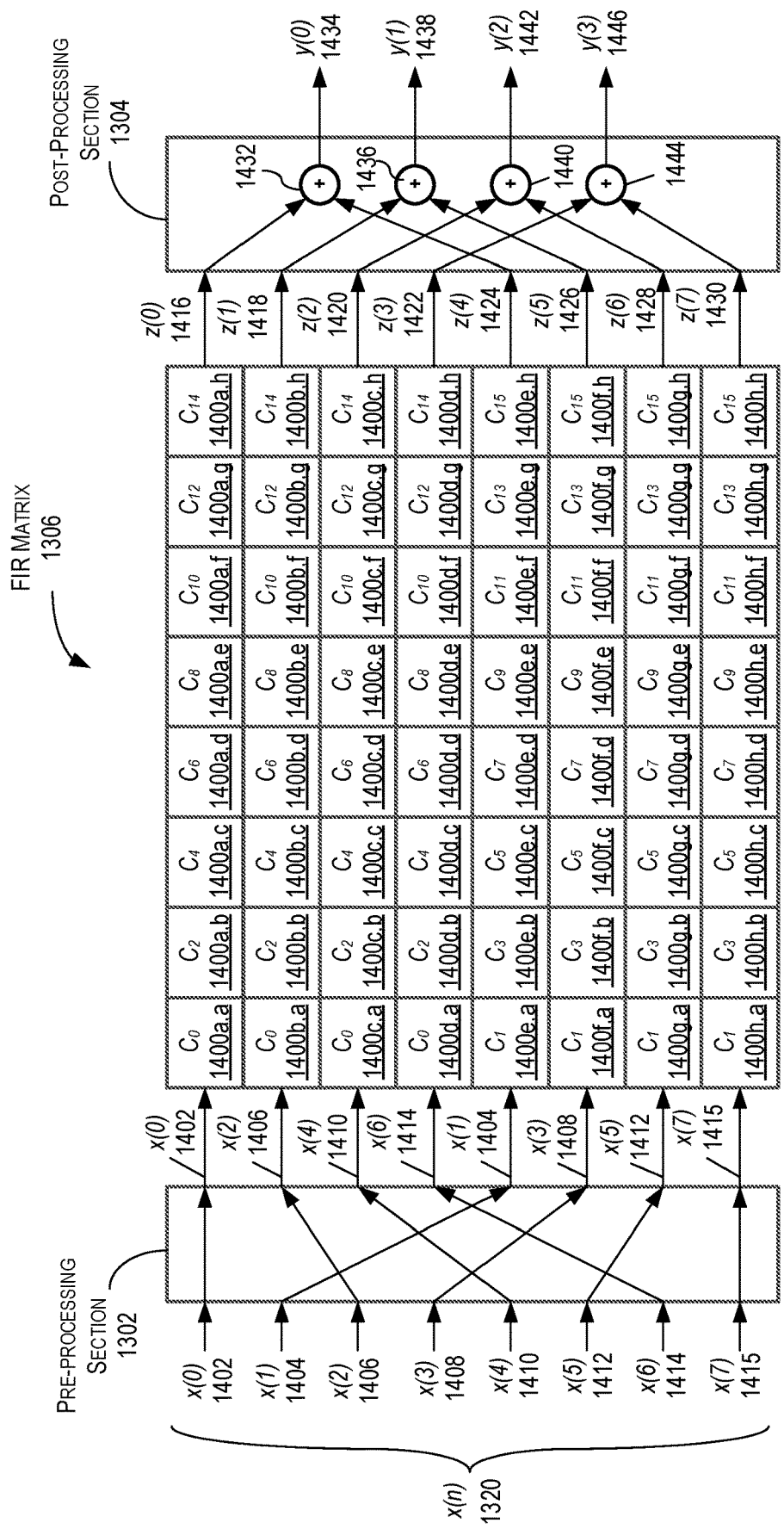
FIG. 14 is a system block diagram of an example of an implementation of the coefficient values utilized by the SFIR filter in accordance with the present disclosure.

In FIG. 14, a system block diagram of an example of an implementation of the coefficient values utilized by the SFIR filter 1300 is shown in accordance with the present disclosure. In this example, the FIR Matrix 1306, for purposes of illustration, is shown to be an 8 by 8 filter matrix. In this example, there are eight (8) real inputs, four (4) real outputs, 64 filter taps with 16 tap coefficients, and D equals 2. As such, the FIR Matrix 1306 includes 64 filter taps 1400a,a, 1400a,b, 1400a,c, 1400a,d, 1400a,e, 1400a,f, 1400a,g, 1400a,h, 1400b,a, 1400b,b, 1400b,c, 1400b,d, 1400b,e, 1400b,f, 1400b,g, 1400b,h, 1400c,a, 1400c,b, 1400c,c, 1400c,d, 1400c,e, 1400c,f, 1400c,g, 1400c,h, 1400d,a, 1400d,b, 1400d,c, 1400d,d, 1400d,e, 1400d,f, 1400d,g, 1400d,h, 1400e,a, 1400e,b, 1400e,c, 1400e,d, 1400e,e, 1400e,f, 1400e,g, 1400e,h, 1400f,a, 1400f,b, 1400f,c, 1400f,d, 1400f,e, 1400f,f, 1400f,g, 1400f,h, 1400g,a, 1400g,b, 1400g,c, 1400g,d, 1400g,e, 1400g,f, 1400g,g, 1400g,h, 1400h,a, 1400h,b, 1400h,c, 1400h,d, 1400h,e, 1400h,f, 1400gh,g, and 1400h,h having filter coefficients $C_0$, $C_1$, $C_2$, $C_3$, $C_4$, $C_5$, $C_6$, $C_7$, $C_8$, $C_9$, $C_{10}$, $C_{11}$, $C_{12}$, $C_{13}$, $C_{14}$, and $C_{15}$, respectively.

In this example, the SFIR filter 1300 receives the filter input $x(n)$ 1320 that is input into the pre-processing section 1302 as eight input signals herein referred to as first input signal $x(0)$ 1402, second input signal $x(1)$ 1404, third input signal $x(2)$ 1406, fourth input signal $x(3)$ 1408, fifth input signal $x(4)$ 1410, sixth input signal $x(5)$ 1412, seventh input signal $x(6)$ 1414, and eighth input signal $x(7)$ 1415.

These signals are re-ordered by the pre-processing section 1302 and input into the FIR Matrix 1306, where the first input signal $x(0)$ 1402 is input into the filter tap 1400a,a, the second input signal x(1) 1404 is input into the filter taps 1400e,a, the third input signal x(2) 1406 is input into the filter tap 1400b,a, the fourth input signal x(3) 1408 is input into the filter tap 1400f,a, the fifth input signal x(4) 1410 is input into the filter tap 1400c,a, the sixth input signal x(5) 1412 is input into the filter tap 1400g,a, the seventh input signal x(6) 1414 is input into the filter tap 1400d,a, and the eighth input signal x(7) 1415 is input into the filter tap 1400h,a.

The FIR Matrix 1306 then produces the intermediate outputs z(0) 1416, z(1) 1418, z(2) 1420, z(3) 1422, z(4) 1424, z(5) 1426, z(6) 1428, and z(7) 1430 that are passed to the post-processing section 1106.

As such, the post-processing section 1304 then combines the intermediate outputs z(0) 1416 with z(4) 1424 at a first adder 1432 to produce a first output signal y(0) 1434 and z(1) 1418 with z(5) 1426 at a second adder 1436 to produce an output signal y(1) 1438. Moreover, the intermediate outputs z(2) 1420 and z(6) 1428 at a third adder 1440 to produce a third output signal y(2) 1442 and the intermediate outputs z(3) 1422 and z(7) 1430 at a fourth adder 1444 to produce a fourth output signal y(3) 1446.

Figure 15:
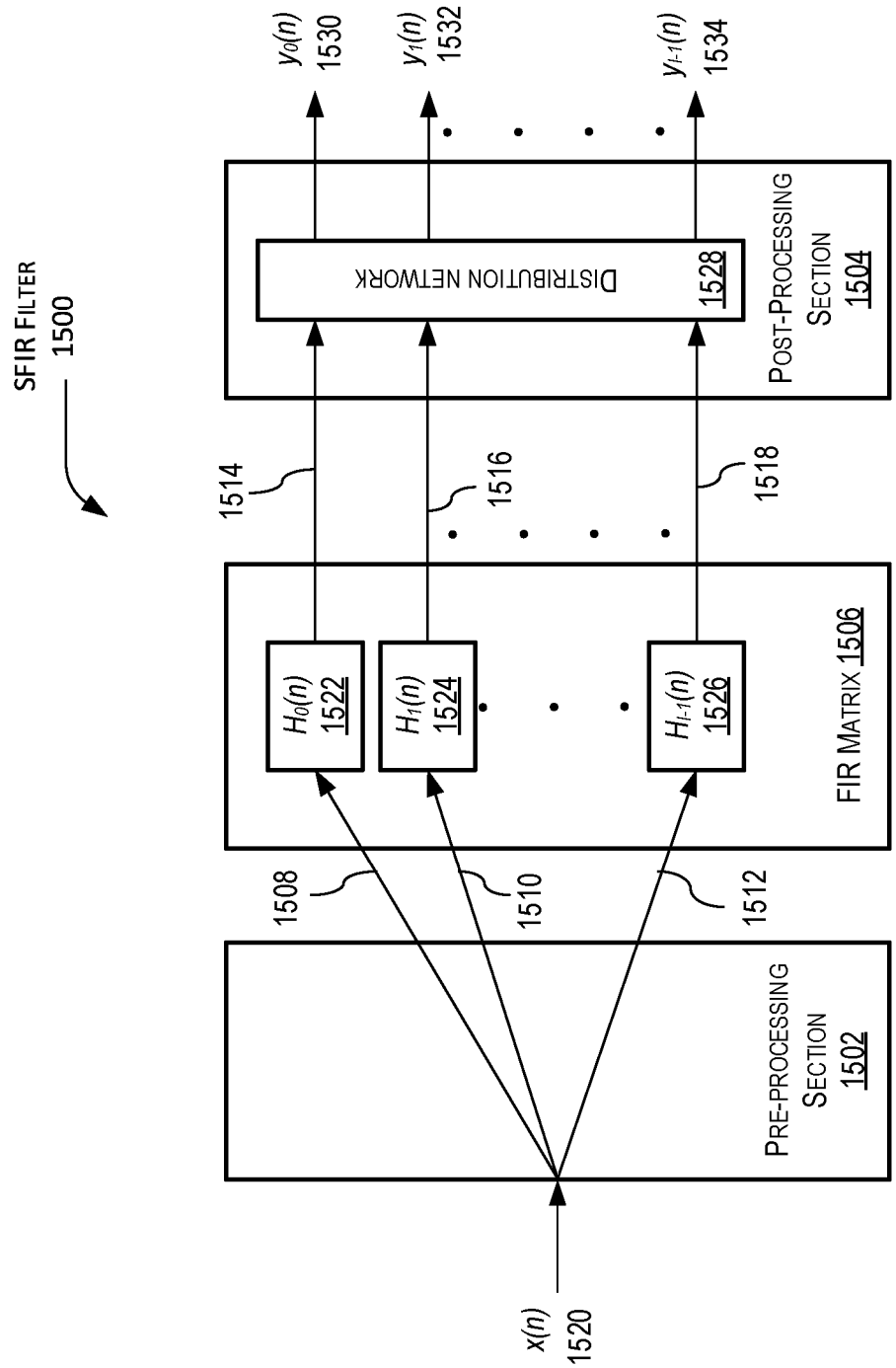
FIG. 15 is a system block diagram of an example of an implementation of an interpolator in the SFIR filter in accordance with the present disclosure.

In FIG. 15, a system block diagram of an example of an implementation of a decimator in the SFIR filter 1500 for a decimator is shown in accordance with the present disclosure. As before, in this example, the SFIR filter 1500 includes a pre-processing section 1502, post-processing section 1504, and FIR Matrix 1506. The FIR Matrix 1506 is in signal communication with both the pre-processing section 1502 and post-processing section 1504 via signal paths 1508, 1510, 1512, 1514, 1516, and 1518, respectively.

In this example, the pre-processing section 1502 receives the filter input x(n) 1520. The pre-processing section 1502 is configured to fan out the filter input x(n) 1520 and feed the FIR sub-filters 1522, 1524, and 1526, respectively. The FIR sub-filters 1522, 1524, and 1526 have the corresponding transfer functions $H_0(n)$, $H_1(n)$, and $H_{I-1}(n)$, where I represents the number of FIR sub-filters present in the FIR Matrix 1306. The post-processing section 1504 is configured to operate as a distribution network 1528.

In this example, the first FIR sub-filter 1522 is in signal communication with the distribution network 1528 via signal path 1514, the second FIR sub-filter 1524 is in signal communication with the distribution network 1528 via signal path 1516, and the third FIR sub-filter 1526 is in signal communication with the distribution network 1528 via signal path 1518. The distribution network 1528 distributes and re-orders the intermediate filter outputs of the FIR sub-filters 1522, 1524, and 1526 to produce the filter outputs $y_0(n)$ 1530, $y_1(n)$ 1532, and $y_{I-1}(n)$ 1534.

In an example of operation, the first FIR sub-filter 1522 receives a filter input from pre-processing section 1502, filters it, and outputs an intermediate filter output that is passed to the distribution network 1528. Simultaneously: the second FIR sub-filter 1524 receives a filter input from the from pre-processing section 1502, filters it, and outputs another intermediate filter output that is passed to the distribution network 1528; and the third FIR sub-filter 1526 receives a filter input from the from pre-processing section 1502, filters it, and outputs another intermediate filter output that is passed to the distribution network 1528.

The intermediate filter outputs from the FIR sub-filters 1522, 1524, and 1526 are received by the distribution network 1528 and distributed and re-order to produce the filter outputs $y_0(n)$ 1530, $y_1(n)$ 1532, and $y_{I-1}(n)$ 1534. In this example, then number of inputs in the filter input x(n) 1520 are interpolated into n times I number of filter outputs $y_0(n)$ 1530, $y_1(n)$ 1532, and $y_{I-1}(n)$ 1534, where the number I represents the number of FIR sub-filters present in the FIR Matrix 1306.

Figure 16:
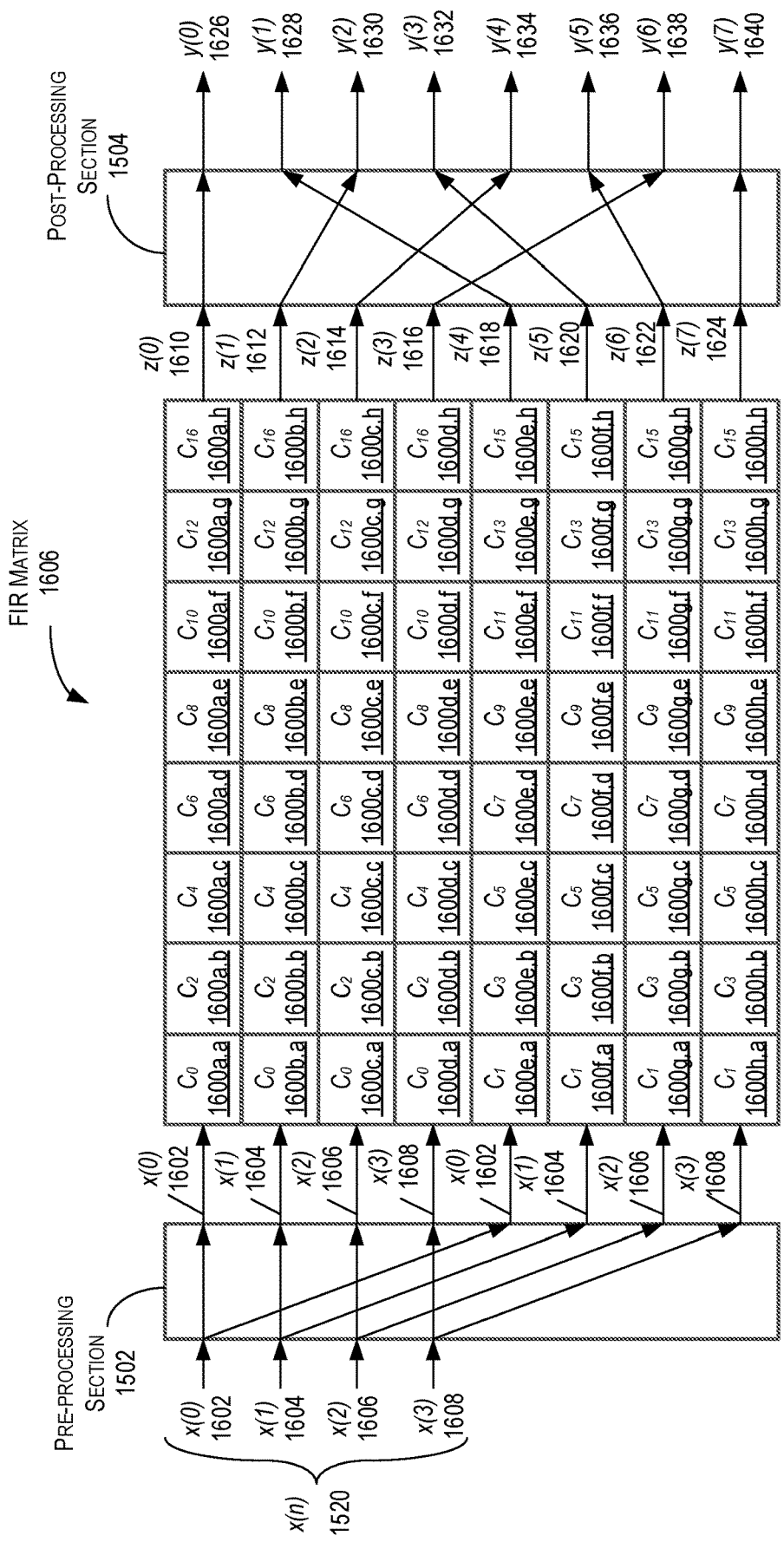
FIG. 16 is a system block diagram of an example of an implementation of the coefficient values utilized by the SFIR filter in accordance with the present disclosure.

In FIG. 16, a system block diagram of an example of an implementation of the coefficient values utilized by the SFIR filter 1500 for an interpolator is shown in accordance with the present disclosure. In this example, the FIR Matrix 1506, for purposes of illustration, is shown to be an 8 by 8 filter matrix. In this example, there are eight (8) real inputs, four (4) real outputs, 64 filter taps with 16 tap coefficients, and D equals 2. As such, the FIR Matrix 1506 includes 64 filter taps 1600a,a, 1600a,b, 1600a,c, 1600a,d, 1600a,e, 1600a,f, 1600a,g, 1600a,h, 1600b,a, 1600b,b, 1600b,c, 1600b,d, 1600b,e, 1600b,f, 1600b,g, 1600b,h, 1600c,a, 1600c,b, 1600c,c, 1600c,d, 1600c,e, 1600c,f, 1600c,g, 1600c,h, 1600d,a, 1600d,b, 1600d,c, 1600d,d, 1600d,e, 1600d,f, 1600d,g, 1600d,h, 1600e,a, 1600e,b, 1600e,c, 1600e,d, 1600e,e, 1600e,f, 1600e,g, 1600e,h, 1600f,a, 1600f,b, 1600f,c, 1600f,d, 1600f,e, 1600f,f, 1600f,g, 1600f,h, 1600g,a, 1600g,b, 1600g,c, 1600g,d, 1600g,e, 1600g,f, 1600g,g, 1600g,h, 1600h,a, 1600h,b, 1600h,c, 1600h,d, 1600h,e, 1600h,f, 1600gh,g, and 1600h,h having filter coefficients $C_0$, $C_1$, $C_2$, $C_3$, $C_4$, $C_5$, $C_6$, $C_7$, $C_8$, $C_9$, $C_{10}$, $C_{11}$, $C_{12}$, $C_{13}$, $C_{14}$, and $C_{15}$, respectively.

In this example, the SFIR filter 1500 receives the filter input x(n) 1520 that is input into the pre-processing section 1502 as four (4) input signals herein referred to as first input signal x(0) 1602, second input signal x(1) 1604, third input signal x(2) 1606, and fourth input signal x(3) 1608. These signals are fanned out by the pre-processing section 1502 and input into the FIR Matrix 1506, where the first input signal x(0) 1602 is input into the filter taps 1600a,a and 1600e,a, the second input signal x(1) 1604 is input into the filter taps 1600b,a and 1600f,a, the third input signal x(2) 1606 is input into the filter tap 1600c,a and 1600g,a, the fourth input signal x(3) 1608 is input into the filter tap 1600d,a and 1600h,a. The FIR Matrix 1506 then produces the intermediate outputs z(0) 1610, z(1) 1612, z(2) 1614, z(3) 1616, z(4) 1618, z(5) 1620, z(6) 1622, and z(7) 1624 that are passed to the post-processing section 1504.

As such, the post-processing section 1504 then re-orders, with the distribution network 1528, the intermediate outputs z(0) 1610, z(1) 1612, z(2) 1614, z(3) 1616, z(4) 1618, z(5) 1620, z(6) 1622, and z(7) 1624 to produce the filter output signals y(0) 1626, y(1) 1628, y(2) 1630, y(3) 1632, y(4) 1634, y(5) 1636, y(6) 1638, and y(7) 1640.

In this example, the SFIR filter 1500 receives four (4) real input signals x(0) 1602, x(1) 1604, x(2) 1606, and x(3) and produces eight (8) real output signals y(0) 1626, y(1) 1628, y(2) 1630, y(3) 1632, y(4) 1634, y(5) 1636, y(6) 1638, and y(7) 1640 based on I equal to 2 and 16 real coefficients.

It will be understood that various aspects or details of the disclosure may be changed without departing from the scope of the disclosure. It is not exhaustive and does not limit the claimed disclosures to the precise form disclosed. Furthermore, the foregoing description is for the purpose of illustration only, and not for the purpose of limitation. Modifications and variations are possible in light of the above description or may be acquired from practicing the disclosure. The claims and their equivalents define the scope of the disclosure.

In some alternative examples of implementations, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different examples of implementations has been presented for purposes of illustration and description, and is not intended to be exhaustive or limited to the examples in the form disclosed. Many modifications and variations will be apparent to those of ordinary skill in the art. Further, different examples of implementations may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

What is claimed is:

1. A Scalable Finite Impulse Response ("SFIR") filter comprising
    a pre-processing section;
    a post-processing section; and
    a finite impulse response ("FIR") Matrix coupled to the pre-processing section and the post-processing section, wherein the FIR Matrix includes:
        a plurality of filter taps including a first filter tap, a second filter tap, and a third filter tap, the first filter tap configured to perform a first operation and to provide a first result of the first operation at an output of the first filter tap, the third filter tap configured to perform a second operation and to provide a second result of the second operation at an output of the third filter tap, and the second filter tap having a first input coupled to the output of the first filter tap and having a second input coupled to the output of the third filter tap; and
        a plurality of signal paths arranged to allow re-configurable data throughput between each filter tap of the plurality of filter taps.

2. The SFIR filter of claim 1, wherein the FIR Matrix further includes a fourth filter tap coupled to the output of the first filter tap and the output of the third filter tap.

3. The SFIR filter of claim 2, wherein the second each filter tap includes:
    a multiplexer coupled to the first input and to the second input,
    a first flip-flop coupled to an output of the multiplexer,
    a gain section,
    a second flip-flop, and
    an adder coupled to the gain section multiplier and the second flip-flop.

4. The SFIR filter of claim 3, wherein the gain section includes a gain section multiplier and a coefficient section.

5. The SFIR filter of claim 4, wherein each flip-flop, of the second filter tap, is a D flip-flop.

6. The SFIR filter of claim 3, wherein the plurality of signal paths includes:
    a first serial signal path from the first filter tap to the second filter tap,
    a second serial signal path from the second filter tap to the third filter tap,
    a first cross signal path from the first filter tap to the fourth filter tap,
    a second cross signal path from the third filter tap to the second filter tap, and
    a third serial signal path from the third filter tap to the fourth filter tap.

7. The SFIR filter of claim 6, wherein:
    the first serial signal path is a signal path from an output of a first filter tap multiplexer to an input of a second filter tap multiplexer,
    the second serial signal path is a signal path from an output of the second filter tap multiplexer to an input of a third filter tap multiplexer,
    the first cross signal path is a signal path from the output of the first filter tap multiplexer to an input of a fourth filter tap multiplexer,
    the second cross signal path from an output of the third filter tap multiplexer to the input of the second filter tap multiplexer, and
    the third serial signal path from the output of the third filter tap multiplexer to the input of the fourth filter tap multiplexer.

8. The SFIR filter of claim 7, wherein the plurality of signal paths further includes:
    a first adder signal path from a first filter tap adder to a second filter tap second flip-flop, and
    a second adder signal path from a third filter tap adder to a fourth filter tap second flip-flop.

9. The SFIR filter of claim 8, wherein the plurality of signal paths further includes:
    a first pipeline data signal path from a first filter first flip-flop to the second filter tap second flip-flop through a first filter gain section multiplier and a first filter adder, and
    a second pipeline data signal path from a third filter first flip-flop to the fourth filter tap second flip-flop through a third filter gain section multiplier and a third filter adder.

10. The SFIR filter of claim 9, wherein the plurality of signal paths are arranged to configure the SFIR filter into a one serial input four tap filter or a two parallel input two tap filter.

11. The SFIR filter of claim 1, wherein the SFIR filter is a type of filter chosen from the group consisting of a Hilbert transform filter, a decimator, an interpolator, a real FIR filter, a complex FIR filter, and an adaptive filter.

12. The SFIR filter of claim 1, wherein the SFIR filter is configured to operate as a real FIR filter and includes the pre-processing section configured as a first pass-through device and the post-processing section configured as a second pass-through device.

13. The SFIR filter of claim 1, wherein the SFIR filter is configured to operate as a complex FIR filter and includes the pre-processing section configured as a fan-out device and the post-processing section configured as a summation device.

14. The SFIR filter of claim 1, wherein the SFIR filter is configured to operate as a decimator and includes the pre-processing section configured as a re-order device and the post-processing section configured as a summation device.

15. The SFIR filter of claim 1, wherein the SFIR filter is configured to operate as an interpolator and includes the pre-processing section configured as a fan-out device and the post-processing section configured as a re-order device.

16. A Scalable Finite Impulse Response ("SFIR") filter comprising:
    means for pre-processing;
    means for post-processing; and
    a finite impulse response ("FIR") filtering matrix coupled to the means for pre-processing and the means for post-processing, wherein the FIR filtering matrix includes:

a plurality of filter taps including a first filter tap, a second filter tap, and a third filter tap, the first filter tap configured to perform a first operation and to provide a first result of the first operation at an output of the first filter tap, the third filter tap configured to perform a second operation and to provide a second result of the second operation at an output of the third filter tap, and the second filter tap having a first input coupled to the output of the first filter tap and having a second input coupled to the output of the third filter tap; and a plurality of signal paths, wherein the plurality of signal paths includes means to allow re-configurable data throughput between each filter tap of the plurality of filter taps.

17. An Application Specific Integrated Circuit ("ASIC") comprising:
a Scalable Finite Impulse Response ("SFIR") filter including:
a pre-processing section,
a post-processing section, and
a finite impulse response ("FIR") Matrix coupled to the pre-processing section and the post-processing section, wherein the FIR Matrix includes:
a plurality of filter taps including a first filter tap, a second filter tap, and a third filter tap, the first filter tap configured to perform a first operation and to provide a first result of the first operation at an output of the first filter tap, the third filter tap configured to perform a second operation and to provide a second result of the second operation at an output of the third filter tap, and the second filter tap having a first input coupled to the output of the first filter tap and having a second input coupled to the output of the third filter tap; and
a plurality of signal paths filter tap of the plurality of filter taps.

18. The ASIC of claim 17, wherein the second filter tap includes:
a multiplexer,
a first flip-flop coupled to an output of the multiplexer,
a gain section having a gain section multiplier and a coefficient section,
a second flip-flop, and
an adder coupled to the gain section and the second flip-flop.

19. The ASIC of claim 18, wherein the FIR Matrix further includes a fourth filter tap, and
wherein the plurality of signal paths includes:
a first serial signal path from the first filter tap to the second filter tap,
a second serial signal path from the second filter tap to the third filter tap,
a first cross signal path from the first filter tap to the fourth filter tap,
a second cross signal path from the third filter tap to the second filter tap, and
a third serial signal path from the third filter tap to the fourth filter tap, and
wherein
the first serial signal path is a signal path from an output of a first filter tap multiplexer to an input of a second filter tap multiplexer,
the second serial signal path is a signal path from an output of the second filter tap multiplexer to an input of a third filter tap multiplexer,
the first cross signal path is a signal path from the output of the first filter tap multiplexer to an input of a fourth filter tap multiplexer,
the second cross signal path from an output of the third filter tap multiplexer to the input of the second filter tap multiplexer, and
the third serial signal path from the output of the third filter tap multiplexer to the input of the fourth filter tap multiplexer.

20. The ASIC of claim 19, wherein the plurality of signal paths further includes:
a first adder signal path from a first filter tap adder to a second filter tap second flip-flop, and
a second adder signal path from a third filter tap adder to a fourth filter tap second flip-flop, and
wherein the plurality of signal paths further includes:
a first pipeline data signal path from a first filter first flip-flop to the second filter tap second flip-flop through a first filter gain section multiplier and a first filter adder, and
a second pipeline data signal path from a third filter first flip-flop to the fourth filter tap second flip-flop through a third filter gain section multiplier and a third filter adder.

* * * * *

UNITED STATES PATENT AND TRADEMARK OFFICE
CERTIFICATE OF CORRECTION

PATENT NO. : 10,581,407 B2
APPLICATION NO. : 15/974687
DATED : March 3, 2020
INVENTOR(S) : Kristina M. Skinner, Tyler J. Thrane and Jason A. Ching Page 1 of 1

It is certified that error appears in the above-identified patent and that said Letters Patent is hereby corrected as shown below:

In the Claims

Claim 3, Column 23, Lines 43 through 44, change:
"3. The SFIR filter of claim 2, wherein the second each filter tap includes:"
To read:
--3. The SFIR filter of claim 2, wherein the second filter tap includes:--

Claim 3, Column 23, Lines 50 - 51, change:
"an adder coupled to the gain section multiplier and the second flip-flop."
To read:
--an adder coupled to the gain section and the second flip-flop.--

Claim 17, Column 25, Lines 36 - 37, change:
"a plurality of signal paths filter tap of the plurality of filter taps."
To read:
--a plurality of signal paths arranged to allow re-configurable data throughput between each filter tap of the plurality of filter taps.--

Signed and Sealed this
Thirtieth Day of June, 2020

Andrei Iancu
*Director of the United States Patent and Trademark Office*